US012267992B2

(12) United States Patent
Kao et al.

(10) Patent No.: US 12,267,992 B2
(45) Date of Patent: Apr. 1, 2025

(54) MEMORY DEVICE HAVING CAPACITOR STRUCTURE AND METHOD OF FORMING THE SAME

(71) Applicant: Taiwan Semiconductor Manufacturing Company, Ltd., Hsinchu (TW)

(72) Inventors: Yun-Feng Kao, New Taipei (TW); Katherine H Chiang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 469 days.

(21) Appl. No.: 17/583,227

(22) Filed: Jan. 25, 2022

(65) Prior Publication Data
US 2023/0132910 A1    May 4, 2023

Related U.S. Application Data

(60) Provisional application No. 63/275,926, filed on Nov. 4, 2021.

(51) Int. Cl.
*H10B 12/00* (2023.01)
*H01L 23/522* (2006.01)
*H01L 49/02* (2006.01)

(52) U.S. Cl.
CPC ....... *H10B 12/033* (2023.02); *H01L 23/5223* (2013.01); *H01L 28/91* (2013.01); *H01L 28/92* (2013.01)

(58) Field of Classification Search
None
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |

(Continued)

*Primary Examiner* — Michelle Mandala
(74) *Attorney, Agent, or Firm* — JCIPRNET

(57) ABSTRACT

A memory device having a capacitor structure and a method of forming the same are provided. The memory device includes a substrate; a dielectric layer disposed on the substrate; and a plurality of capacitor structures respectively disposed in the dielectric layer. Each capacitor structure includes: a cup-shaped lower electrode; a first upper electrode conformally covering an outer surface of the cup-shaped lower electrode; a first capacitor dielectric layer disposed between the outer surface of the cup-shaped lower electrode and the first upper electrode; a second upper electrode conformally covering an inner surface of the cup-shaped lower electrode, wherein the second upper electrode is electrically connected to the first upper electrode by at least one connection via; and a second capacitor dielectric layer disposed between the inner surface of the cup-shaped lower electrode and the second upper electrode.

20 Claims, 24 Drawing Sheets

(56) References Cited

U.S. PATENT DOCUMENTS

| | | |
|---|---|---|
| 9,576,814 B2 | 2/2017 | Wu et al. |
| 2011/0159662 A1* | 6/2011 | Chung ................ H10B 12/033 |
| | | 257/E21.011 |
| 2018/0166449 A1* | 6/2018 | Pak ........................ H10N 97/00 |
| 2020/0152732 A1* | 5/2020 | Park ........................ H01L 28/91 |
| 2021/0183994 A1* | 6/2021 | Lee ......................... H01L 28/90 |

\* cited by examiner

MEMORY DEVICE HAVING CAPACITOR STRUCTURE AND METHOD OF FORMING THE SAME

CROSS-REFERENCE TO RELATED APPLICATION

This application claims the priority benefit of U.S. provisional application Ser. No. 63/275,926, filed on Nov. 4, 2021. The entirety of the above-mentioned patent application is hereby incorporated by reference herein and made a part of this specification.

BACKGROUND

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage; while for RF circuits, capacitors are used in oscillators and phase-shift networks for coupling and/or bypassing purposes. For microprocessors, capacitors are used for decoupling. The traditional way to combine these capacitors on a same chip is to fabricate them in different metal layers.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater storage density, as well as lower power consumption and latency has grown recently, there has grown a need for smaller and more creative design techniques of electronic components in semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
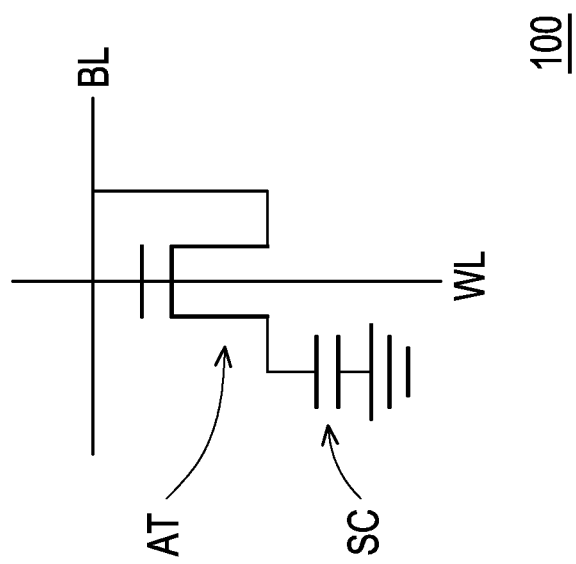
FIG. 1 is a circuit diagram illustrating a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures The spatially relative terms are intended to encompass different orientations of the device in use or operation in addition to the orientation depicted in the Figures The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

MIM (metal-insulator-metal) capacitors typically comprise a capacitor dielectric layer arranged between an upper conductive electrode and a lower conductive electrode. The upper conductive electrode and the lower conductive electrode are often disposed within an inter-level dielectric (ILD) layer on a back-end-of-the-line (BEOL) of an integrated chip. To achieve a sufficiently high capacitance for integrated chip applications, MIM capacitors often consume a relatively large area of an integrated chip.

While the minimum feature sizes of integrated chips (e.g., gate sizes, metal interconnect sizes, etc.) continue to decrease, MIM capacitors are unable to similarly scale their size without decreasing their capacitance. This is because the capacitance of a MIM capacitor is directly proportional to an area of the upper conductive electrode and the lower conductive electrode. Therefore, as the minimum features sizes of integrated chips decrease MIM capacitors are consuming proportionally larger areas of a substrate to achieve a same capacitance, and thus are becoming increasingly expensive.

In accordance with some embodiments, a capacitor structure with a double-layered capacitor dielectric structure (or double-layered storage structure) is provided. The capacitor structure can provide a relatively large capacitance while consuming a relatively small area of a substrate. In addition, in the present embodiment, the first upper electrode and the second upper electrode are electrically connected to each other through the connection vias. Therefore, the first and second upper electrodes of the two adjacent capacitor structures can be regarded as equipotential during operation. In this case, a memory device having the capacitor structure with the double-layered storage structure is able to have both the advantages of high charge capacity and low the parasitic capacitance.

FIG. 1 is a circuit diagram illustrating a memory device 100 in accordance with some embodiments. Although the following embodiment is illustrated a dynamic random access memory (DRAM) device as an example, the embodiments of the present disclosure are not limited thereto.

Referring to FIG. 1, the memory device 100 may include an access transistor AT and a storage capacitor SC. The access transistor AT is a field effect transistor (FET). A terminal of the storage capacitor SC is coupled to a source/drain terminal of the access transistor AT, while the other terminal of the storage capacitor SC may be coupled to a reference voltage (e.g., a ground voltage as depicted in FIG. 1). When the access transistor AT is turned on, the storage capacitor SC can be accessed. On the other hand, when the access transistor AT is in an off state, the storage capacitor SC is inaccessible.

During a write operation, the access transistor AT is turned on by asserting a word line WL coupled to a gate terminal of the access transistor AT, and a voltage applied on a bit line BL coupled to a source/drain terminal of the access transistor AT may be transferred to the storage capacitor SC coupled the other source/drain terminal of the access transistor AT. Accordingly, the storage capacitor SC may be charged or discharged, and a logic state "1" or a logic state "0" can be stored in the storage capacitor SC. During a read operation, the access transistor AT is turned on as well, and the bit line BL being pre-charged may be pulled up or pulled down according to a charge state of the storage capacitor SC. By comparing a voltage of the bit line BL with a reference voltage, the charge state of the storage capacitor SC can be sensed, and the logic state of the memory device 100 can be identified.

FIGS. 2A, 2B, 3, 4, 5, 6, 7, 8, 9, 10, 11, 12, 13, 14, 15, 16A, 16B, 17A, 17B, 18A, 18B, 18C, and 18D illustrate varying views of manufacturing a memory device 100 in accordance with some embodiments.

Figure 2A:
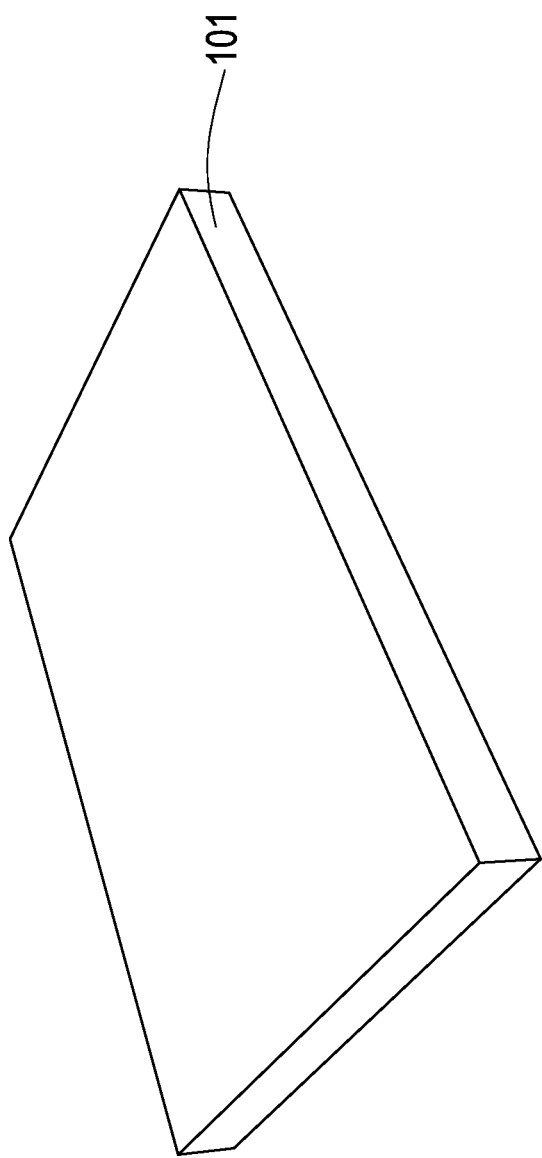
FIGS. 2A, 2B, 3, 4, 5, 6, 7, 8, 9, 10, 11, 12, 13, 14, 15, 16A, 16B, 17A, 17B, 18A, 18B, 18C, and 18D illustrate varying views of manufacturing a memory device in accordance with some embodiments.
Figure 2B:
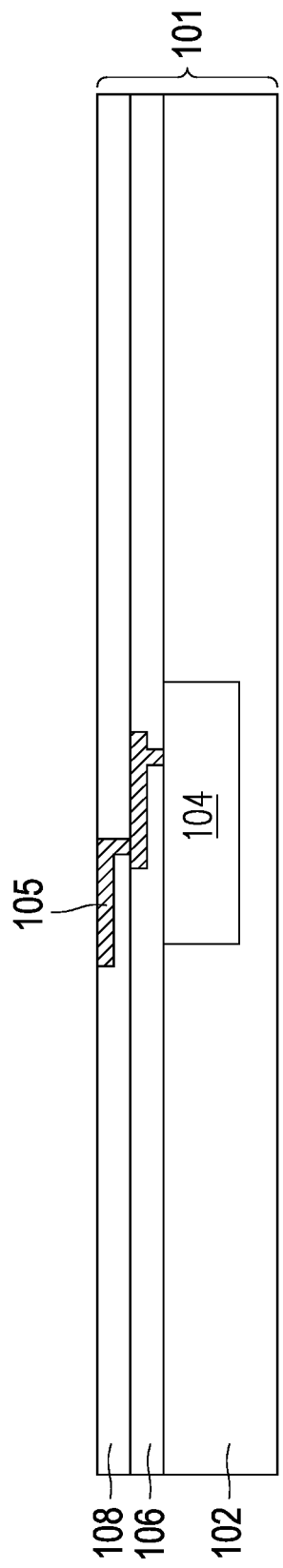

Referring to FIG. 2A and FIG. 2B, a plurality of electrical components 104, such as transistors, resistors, capacitors, inductors, diodes, or the like, are formed in a device region of a semiconductor substrate 102 in the front-end-of-line (FEOL) processing of semiconductor manufacturing. For example, the transistor may include fin field effect transistors (FinFETs), nanostructure transistor, gate-all-around transistor (e.g. nanowire, nanosheet, or the like), planar transistor, etc. The transistor may be formed by gate-first processes or gate-last processes. In the present embodiment, the transistor is the said access transistor AT illustrated in FIG. 1. The semiconductor substrate 102 may be a bulk substrate, such as a silicon substrate, doped or undoped, or an active layer of a semiconductor-on-insulator (SOI) substrate. The semiconductor substrate 102 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or a combination thereof. Other substrates, such as multi-layered or gradient substrates, may also be used. The electrical components 104 may be formed in/on the semiconductor substrate 102 using any suitable formation method known or used in semiconductor manufacturing.

After the electrical components 104 are formed, an interconnect structure is formed over the semiconductor substrate 102 to connect the electrical components 104, so as to form functional circuits. The interconnect structure may include a plurality of dielectric layers (e.g., 106, 108) and electrically conductive features 105 (e.g., vias, metal lines) formed in the dielectric layers.

In some embodiments, the interconnect structure is formed in the back-end-of-line (BEOL) processing of semiconductor manufacturing. Formation of the interconnect structure is known in the art, thus details are not repeated here. To avoid clutter and for ease of discussion, the semiconductor substrate 102, the electrical components 104, and the interconnect structure over the semiconductor substrate 102 are collectively referred to as an underlying structure 101 (as shown in FIG. 2A) in the discussion hereinafter, and the details of the underlying structure 101 illustrated in FIG. 2B may be omitted in subsequent figures.

Figure 3:
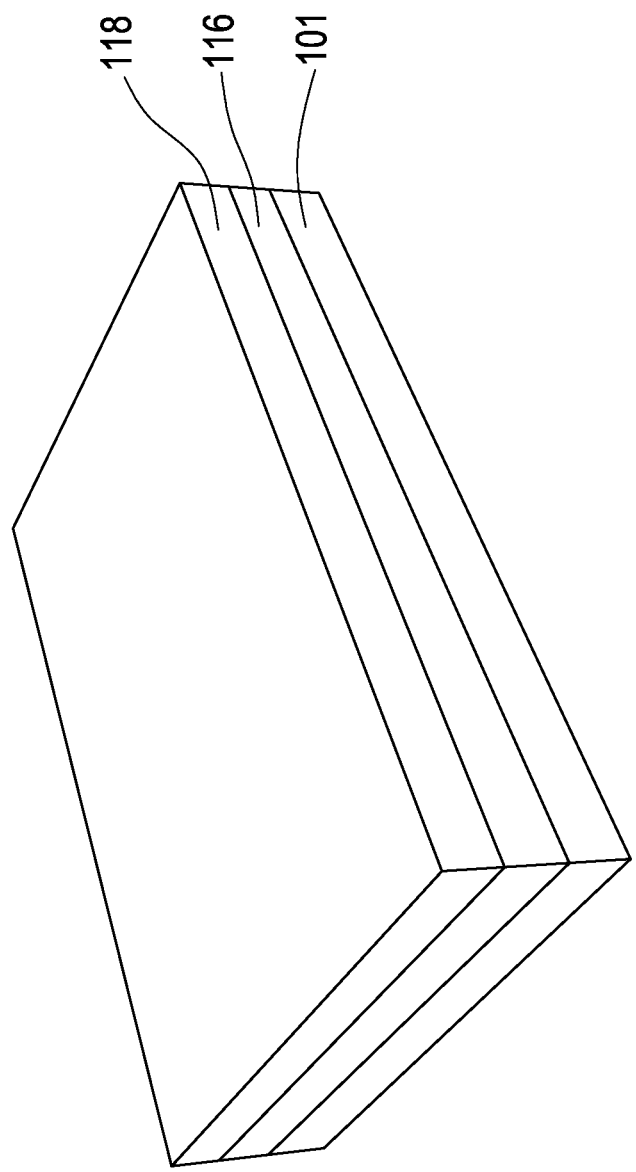

FIG. 3 to FIG. 18A illustrate additional processing steps in the BEOL processing to form the memory device 100 in accordance with some embodiments. Referring to FIG. 3, a dielectric layer 116 and an etching stop layer 118 are sequentially formed on the underlying structure 101.

In some embodiments, the dielectric layer 116 and the etching stop layer 118 may include a dielectric material, such as an organic dielectric material or an inorganic dielectric material. The organic dielectric material may be a polymer, such as polybenzoxazole (PBO), polyimide, benzocyclobutene (BCB), or the like. The inorganic dielectric material may include: a nitride such as silicon nitride or the like; an oxide such as silicon oxide; an oxynitride such as silicon oxynitride; phosphosilicate glass (PSG), borosilicate glass (BSG), boron-doped phosphosilicate glass (BPSG), or the like, or a combination thereof. The dielectric layer 116 and the etching stop layer 118 may be formed, by spin coating, lamination, chemical vapor deposition (CVD), or the like. In some embodiments, the dielectric layer 116 and the etching stop layer 118 have different dielectric materials. For example, the dielectric layer 116 may be a silicon oxide layer and the etching stop layer 118 may be a silicon oxynitride layer.

Figure 4:
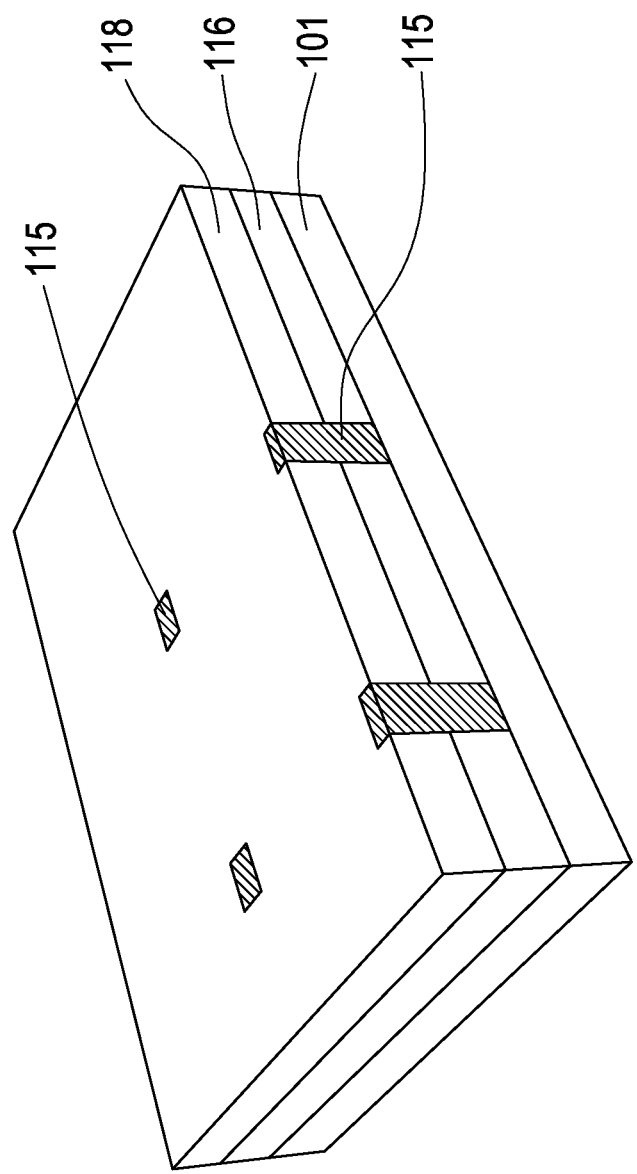

Referring to FIG. 4, a plurality of conductive vias 115 are formed in the dielectric layer 116 and the etching stop layer 118. In some embodiments, the conductive vias 115 include a conductive material, such as metal, polysilicon, silicide, or a combination thereof. The metal may include W, Cu, Al, or a combination thereof. In some embodiments, the conductive vias 115 are formed including following process. A mask layer (not shown) is formed over the etching stop layer 118, and the mask layer is patterned by lithography and etching operations. Then, by using the patterned mask layer as an etching mask, the dielectric layer 116 and the etching stop layer 118 are etched to form via holes (not shown) through the dielectric layer 116 and the etching stop layer 118. The via holes are filled with the conductive material such as W, and then, a planarization operation such as CMP or an etch-back process is performed, so as to remove an upper portion of the conductive material over a top surface of the etching stop layer 118, thereby forming the conductive vias 115. In some embodiments, the conductive vias 115 further includes a barrier layer or a glue layer such as titanium, tantalum, titanium nitride, tantalum nitride, or a combination thereof before forming the conductive material.

Figure 5:
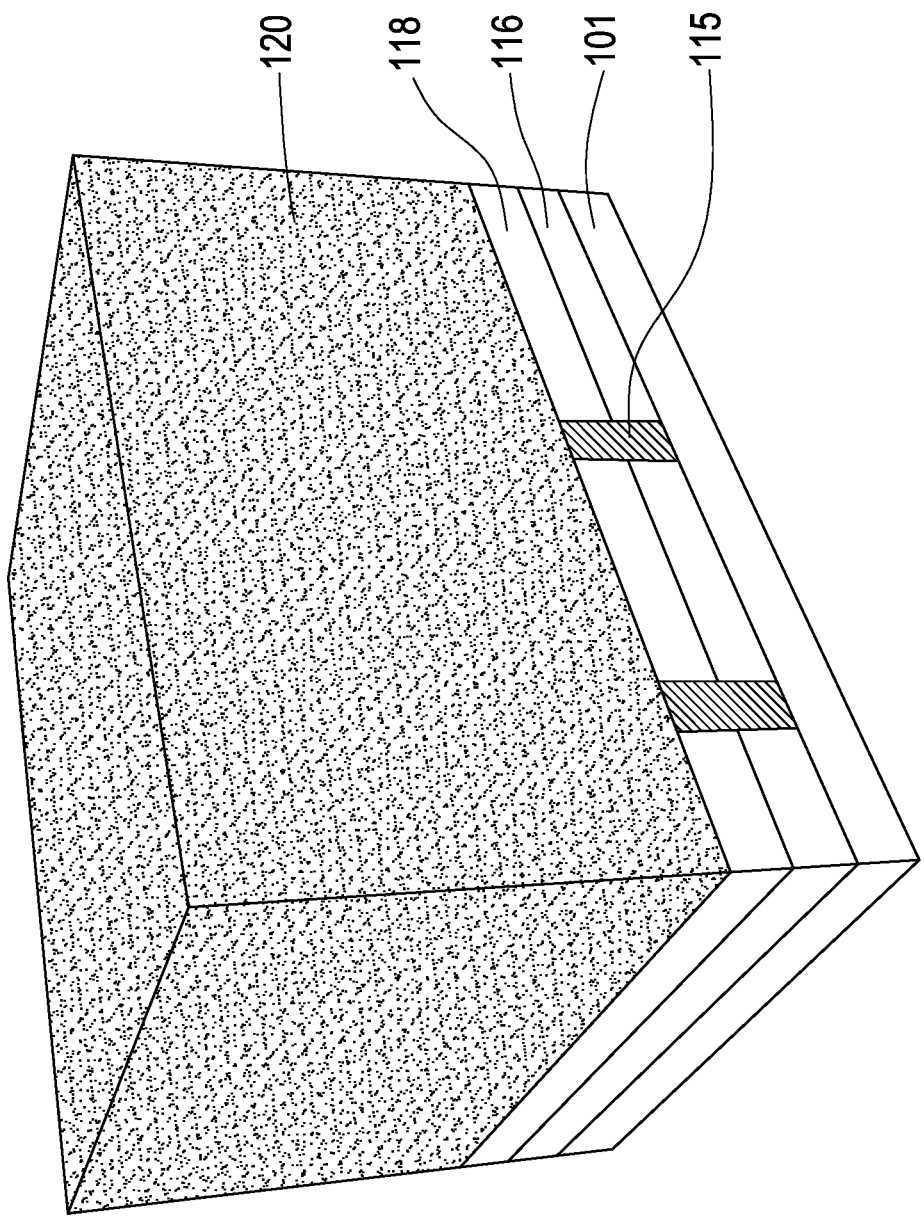

Referring to FIG. 5, a sacrificial layer 120 is formed on the etching stop layer 118 to cover the conductive vias 115.

In some embodiments, the sacrificial layer 120 may include a dielectric material, such as silicon nitride, silicon oxide, silicon oxynitride; phosphosilicate glass (PSG), borosilicate glass (BSG), boron-doped phosphosilicate glass (BPSG), or the like, or a combination thereof. The sacrificial layer 120 may be formed, by spin coating, lamination, CVD, or the like. In the present embodiment, the sacrificial layer 120 is a silicon nitride layer.

Figure 6:
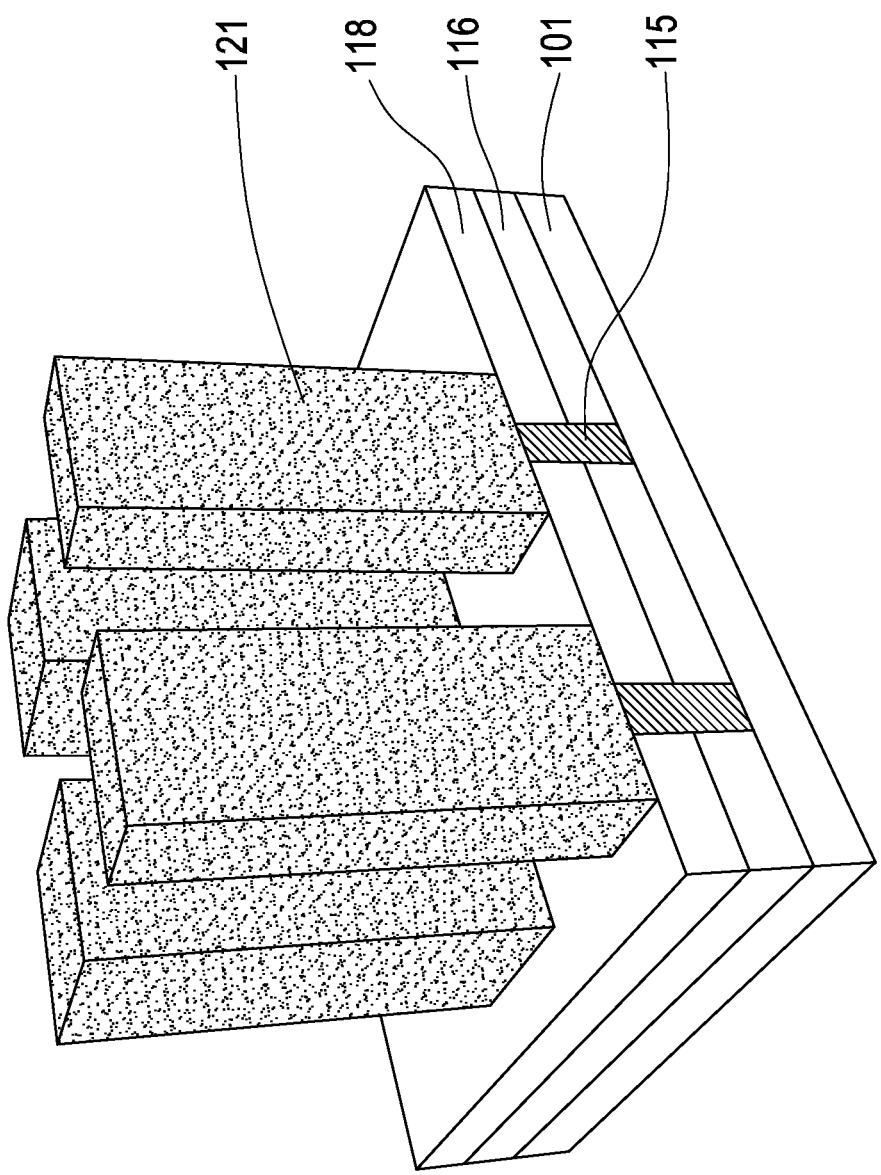

Referring to FIG. 6, the sacrificial layer 120 is patterned to form the plurality of sacrificial structures 121 corresponding to the conductive vias 115 respectively. That is, the sacrificial structures 121 are respectively formed on the conductive vias 115 to cover top surfaces of the conductive vias 115. In some embodiments, the sacrificial layer 120 are formed including following process. A mask layer (not shown) is formed over the sacrificial layer 120, and the mask layer is patterned by lithography and etching operations. Then, by using the patterned mask layer as an etching mask, the sacrificial layer 120 are etched to expose the etching stop layer 118. In this case, the etching stop layer 118 may be referred to as the stop layer during the said etching operation.

Figure 7:
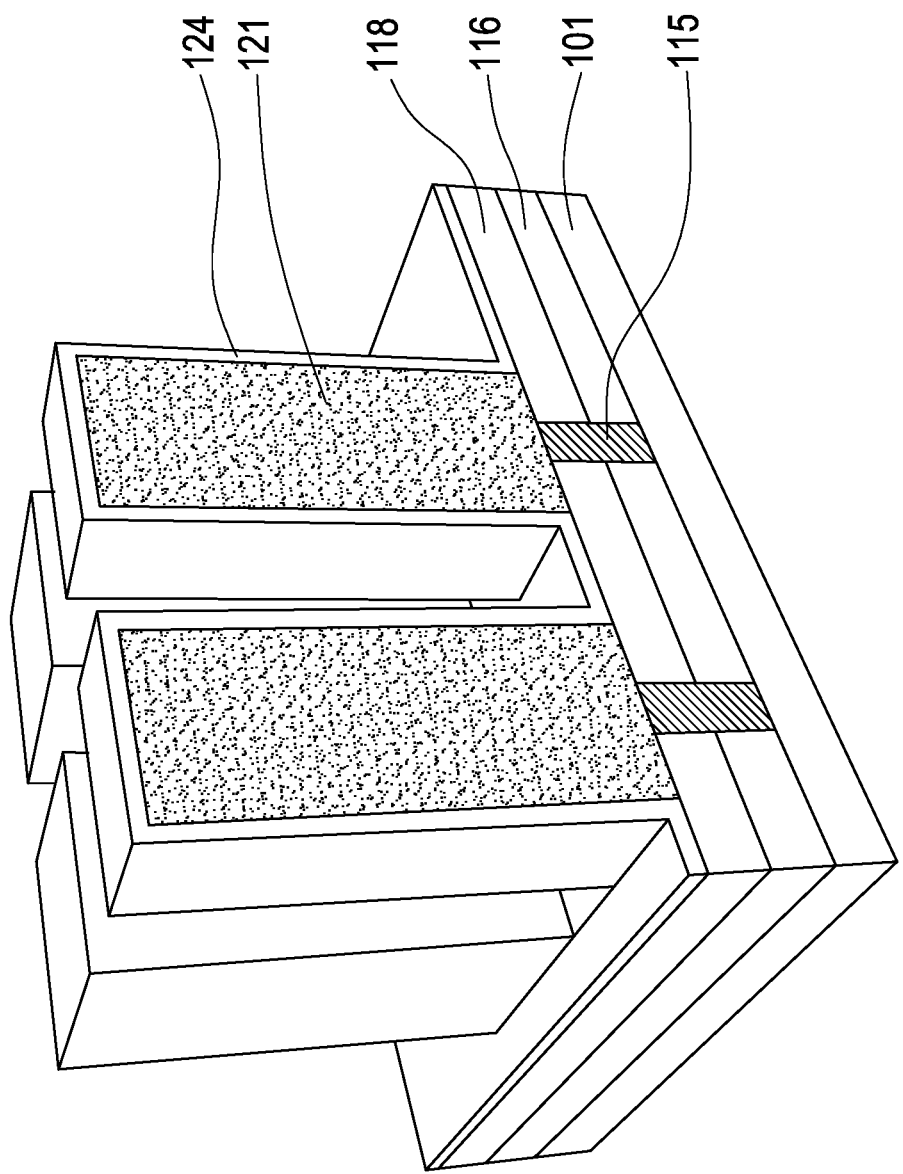

Referring to FIG. 7, a first capacitor dielectric material 124 is formed to conformally cover the etching stop layer 118 and outer surfaces of the sacrificial structures 121. In some embodiments, the first capacitor dielectric material 124 may include a high-k dielectric material, such as aluminum oxide (e.g., $Al_2O_3$), tantalum oxide (e.g., $Ta_2O_5$), lanthanum oxide (e.g., $La_2O_3$), hafnium oxide (e.g., $HfO_2$), zirconium oxide (e.g., $ZrO_2$), zirconium aluminum oxide (e.g., $ZrAl_xO_y$), hafnium aluminum oxide (e.g., $HfAl_xO_y$), bromide titanium oxide (e.g., $BrTiO_2$), strontium titanium oxide (e.g., $SrTiO_2$, $SrTiO_3$), or the like. The first capacitor dielectric material 124 may be formed by one or more deposition processes, such as atomic layer deposition (ALD), CVD, physical vapor deposition (PVD), a combination thereof, and the like. In some embodiments, the first capacitor dielectric material 124 may include a high-k dielectric material with the high selectivity with respect to the sacrificial structures 121 (e.g., silicon nitride). In the present embodiment, the first capacitor dielectric material 124 may be formed as an aluminum oxide layer with a thickness of between about 3 nm and about 15 nm. However, any suitable material and any suitable thickness may be used for the first capacitor dielectric material 124.

Figure 8:
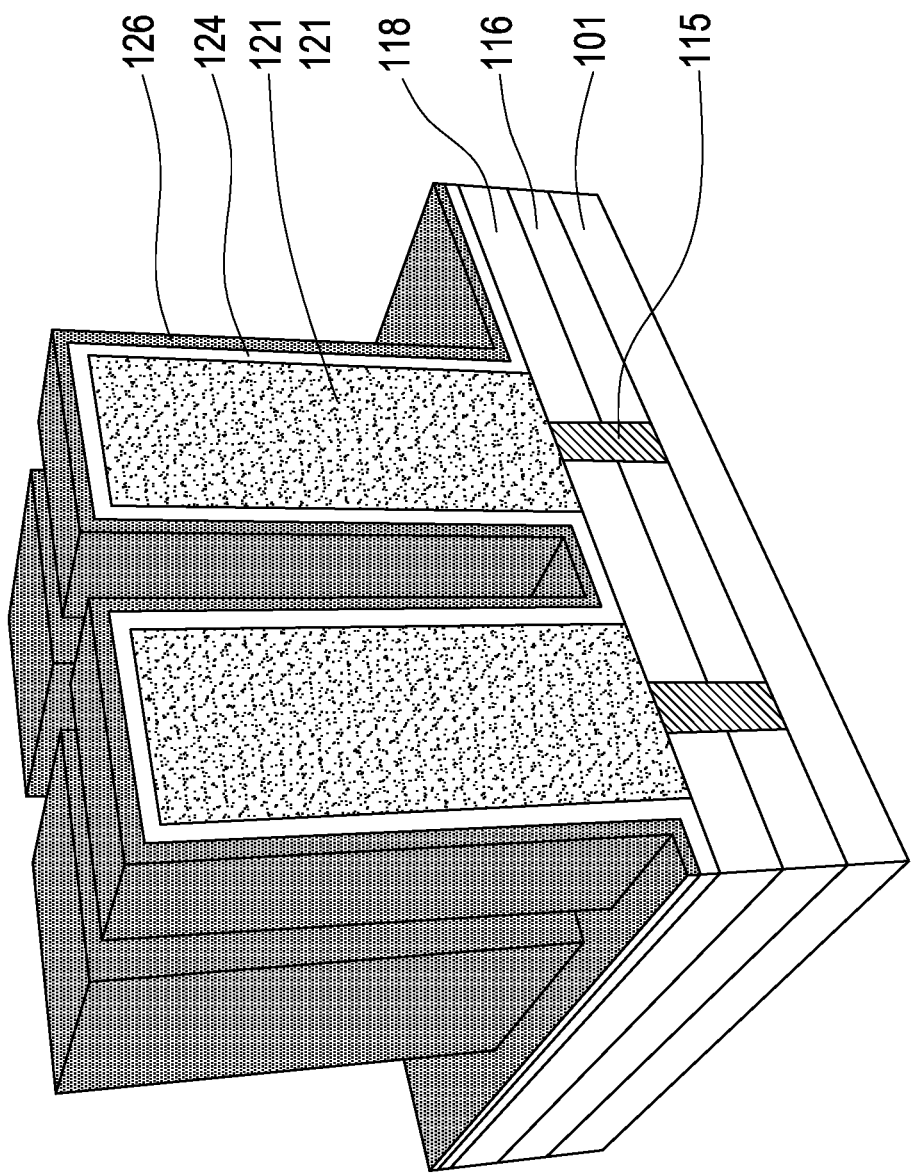

Referring to FIG. 8, a first upper electrode material 126 is formed on the first capacitor dielectric material 124. In some embodiments, the first upper electrode material 126 may include a conductive material with the low resistivity, such as titanium, titanium nitride, tantalum, tantalum nitride, tantalum silicon nitride, titanium silicon nitride, tungsten nitride (e.g., WN, $WN_2$), tungsten silicon nitride, titanium aluminum, copper, aluminum, cobalt, ruthenium, iridium, iridium oxide, platinum, tungsten, or the like. In some embodiments, the first upper electrode material 126 may be formed by one or more deposition processes, such as ALD, CVD, PVD, a combination thereof, and the like. In the present embodiment, the first upper electrode material 126 may be formed as a tantalum nitride layer with a thickness of between about 3 nm and about 50 nm. However, any suitable material and any suitable thickness may be used for the first upper electrode material 126.

Figure 9:
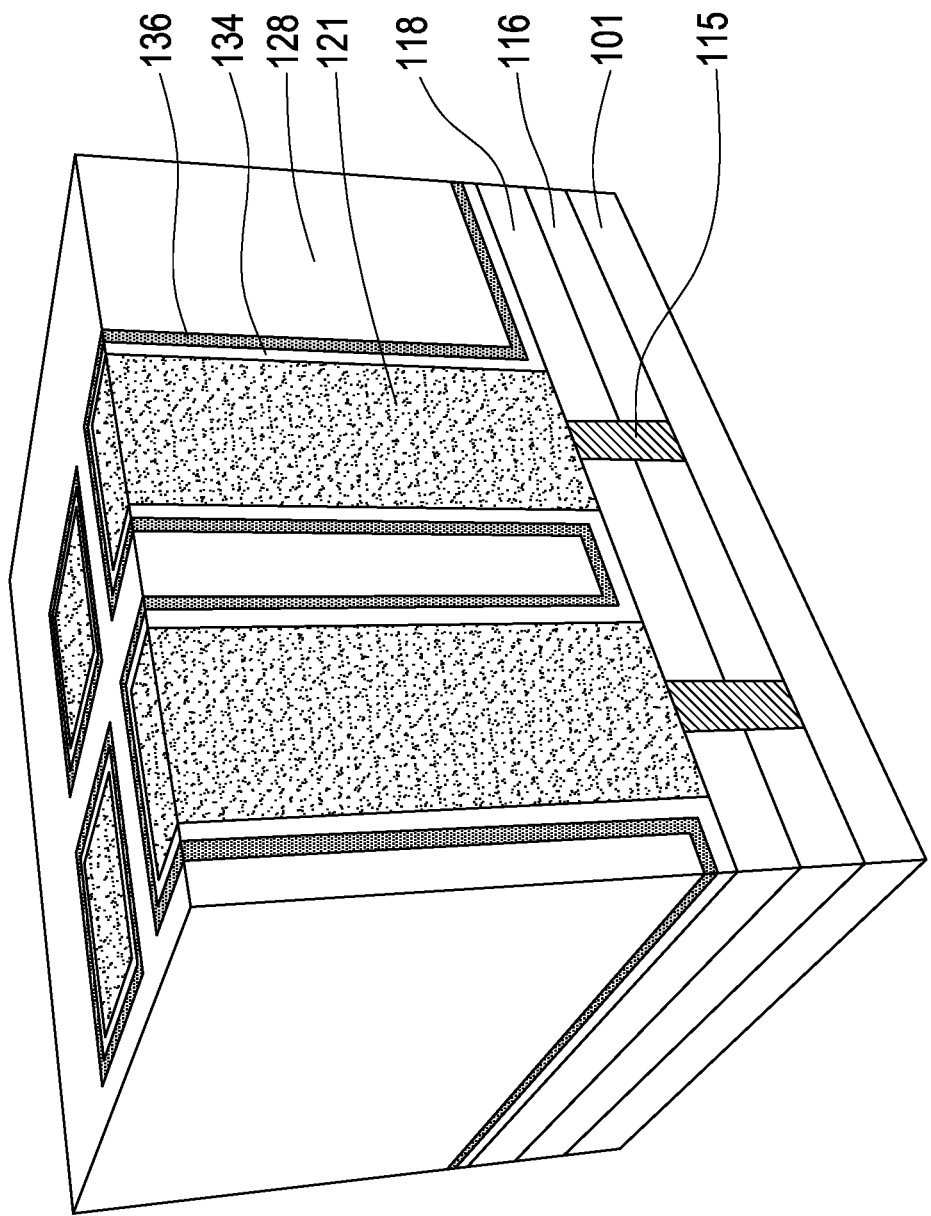

Referring to FIG. 8 and FIG. 9, a dielectric layer 128 is formed to laterally wrap the sacrificial structures 121. Specifically, the dielectric layer 128 is formed including following process. A dielectric material (not shown) is formed on the first upper electrode material 126 and filled in the space between the sacrificial structures 121. A planarization process is performed to remove a portion of the dielectric material, a portion of the first upper electrode material 126, and a portion of the first capacitor dielectric material 124 to expose top surfaces of the sacrificial structures 121, thereby forming the dielectric layer 128, a first upper electrode 136, and a first capacitor dielectric layer 134. In some embodiments, the planarization process includes a chemical-mechanical polishing (CMP) process or the like. The sacrificial structures 121, the dielectric layer 128, the first upper electrode 136, and the first capacitor dielectric layer 134 may have the top surfaces level with each other. After the planarization process, as shown in FIG. 9, the first upper electrode 136 and the first capacitor dielectric layer 134 conformally cover the outer surfaces of the sacrificial structures 121, and the dielectric layer 128 laterally wraps the first upper electrode 136, the first capacitor dielectric layer 134, and the outer surfaces of the sacrificial structures 121.

Figure 10:
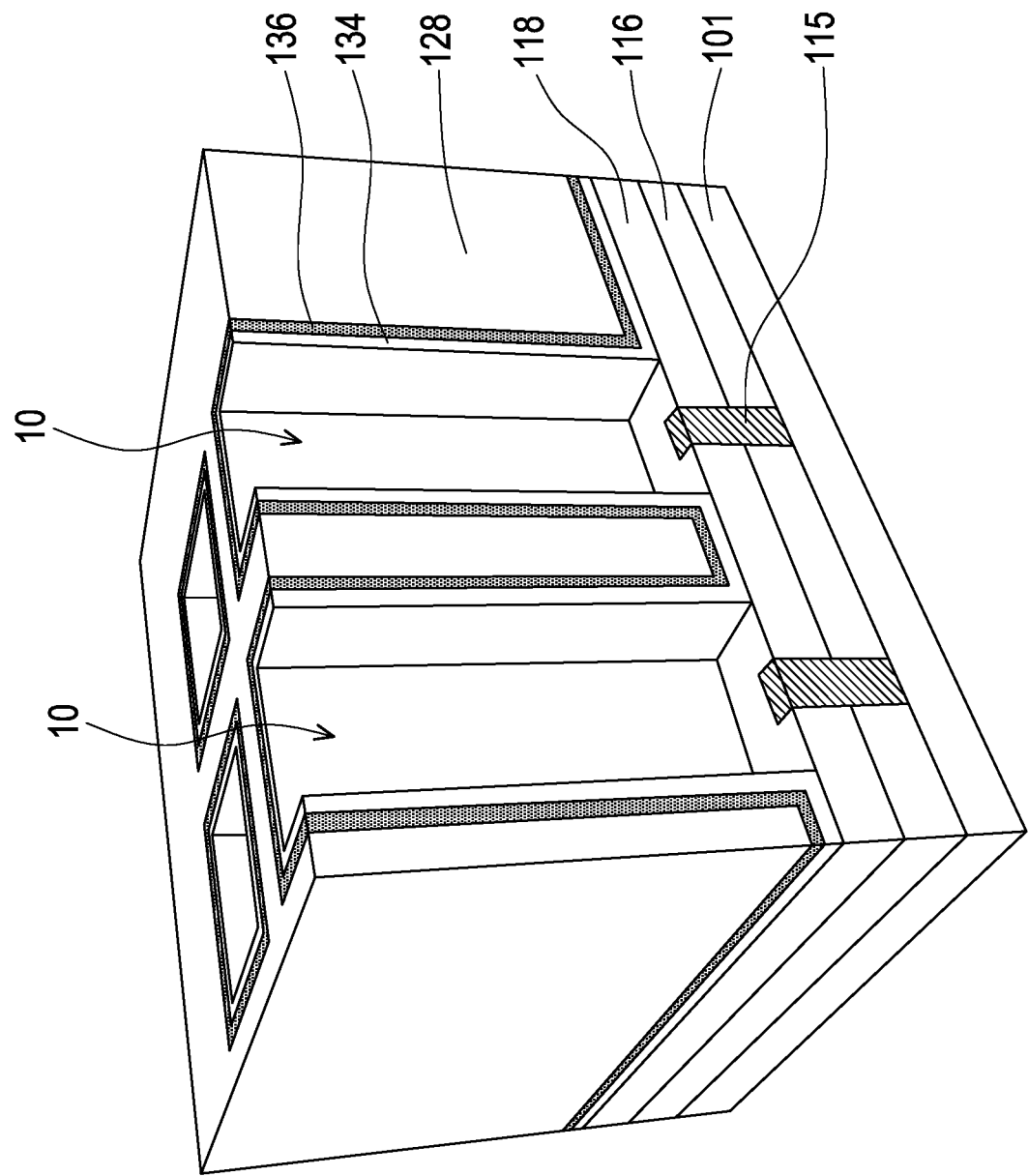

Referring to FIG. 9 and FIG. 10, the sacrificial structures 121 are removed to form a plurality of openings 10 (may also be referred to as first openings). As shown in FIG. 10, the conductive vias 115 are respectively exposed by the openings 10 after removing the sacrificial structures 121. In some embodiments, the sacrificial structures 121 may be removed by any suitable etching process, such as wet etching process, isotropic etching process, or the like. It should be noted that, in some embodiments, the material of the sacrificial structures 121 and the materials of the dielectric layer 128, the first capacitor dielectric layer 134, and the first upper electrode 136 have different etching selectivities. That is, the sacrificial structures 121 would be completely removed, while the dielectric layer 128, the first capacitor dielectric layer 134, and the first upper electrode 136 would not be removed or only a small amount would be removed during the etching process.

Figure 11:
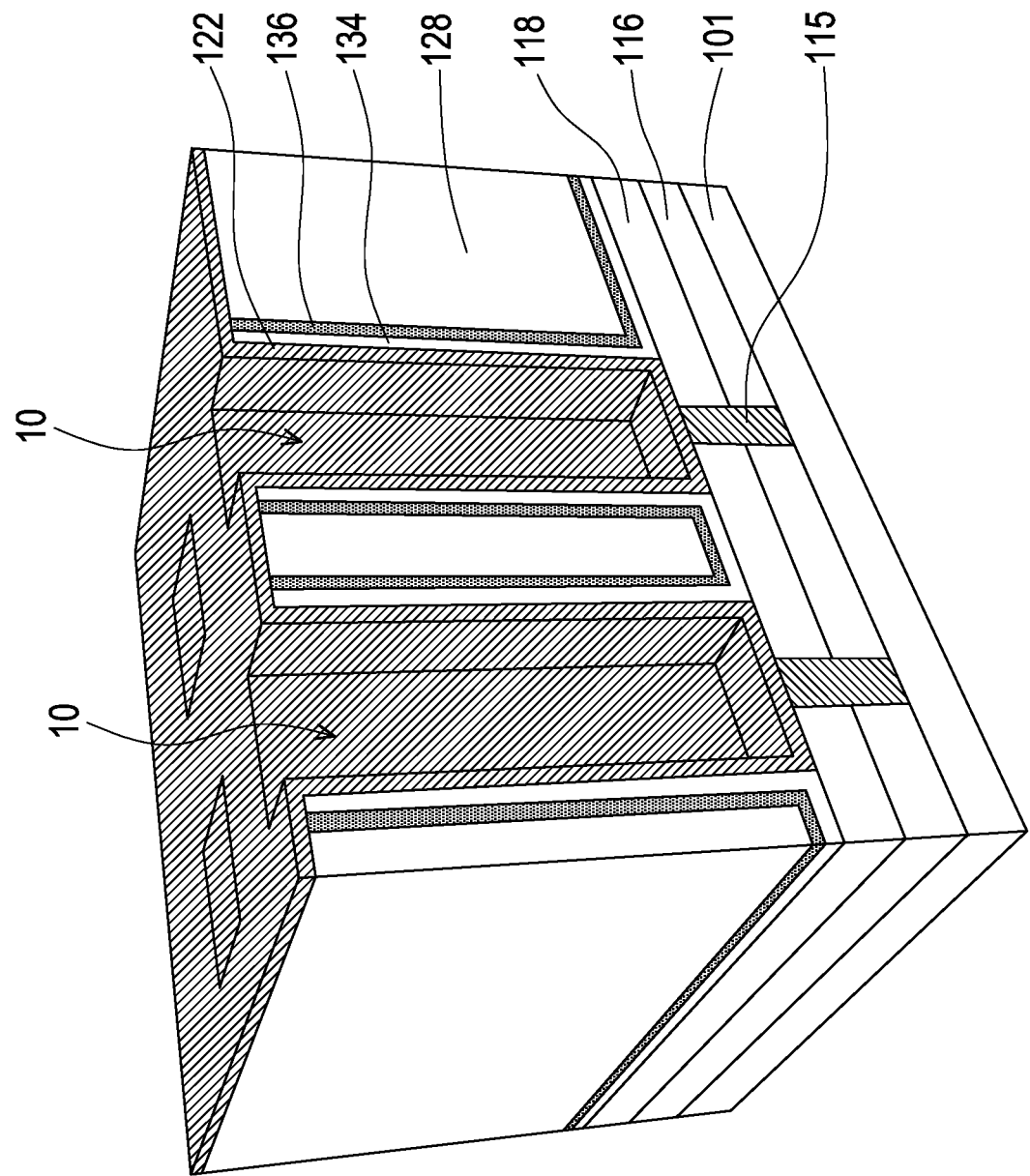

Referring to FIG. 11, a lower electrode material 122 is formed to conformally cover surfaces of the openings 10 and extend to cover the top surfaces of the dielectric layer 128, the first capacitor dielectric layer 134, and the first upper electrode 136. In some embodiments, the lower electrode material 122 may include a conductive material with the low resistivity, such as titanium, titanium nitride, tantalum, tantalum nitride, tantalum silicon nitride, titanium silicon nitride, tungsten nitride (e.g., WN, $WN_2$), tungsten silicon nitride, titanium aluminum, copper, aluminum, cobalt, ruthenium, iridium, iridium oxide, platinum, tungsten, or the like. In some embodiments, the lower electrode material 122 may be formed by one or more deposition processes, such as ALD, CVD, PVD, a combination thereof, and the like. In the present embodiment, the lower electrode material 122 may be formed as a titanium nitride layer with a thickness of between about 3 nm and about 50 nm. However, any suitable material and any suitable thickness may be used for the lower electrode material 122. In some embodiments, the lower electrode material 122 and the first upper electrode material 126 may have the same material or different materials.

Figure 12:
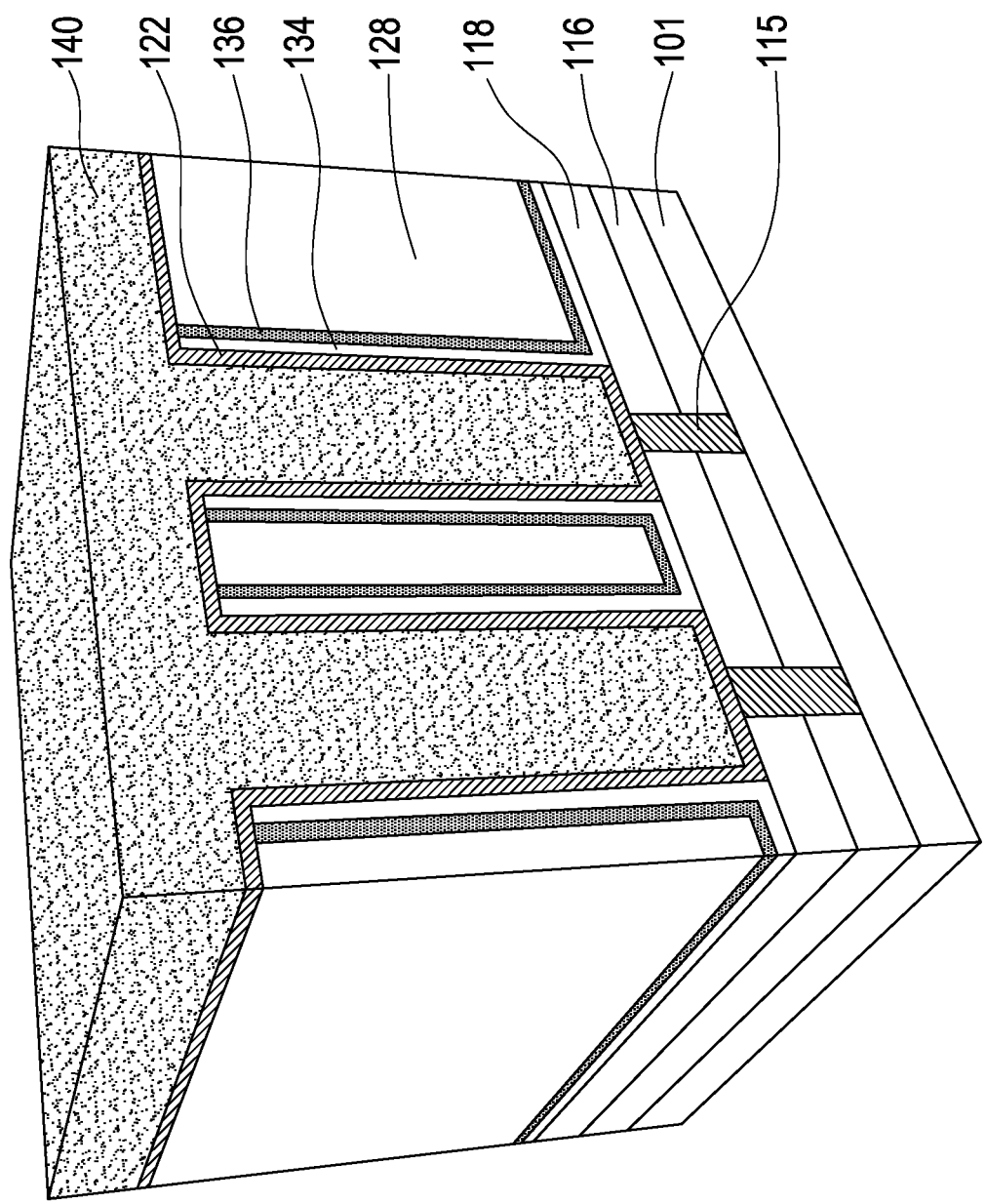

Referring to FIG. 11 and FIG. 12, a filling material 140 is formed on the lower electrode material 122 to fill in the openings 10. In this case, as shown in FIG. 12, the filling material 140 not only fills up the openings 10, but also overlays the top surfaces of the dielectric layer 128, the first capacitor dielectric layer 134, and the first upper electrode 136. In some embodiments, the filling material 140 includes a photoresist material or the like, and may be formed by a spin coating method.

Figure 13:
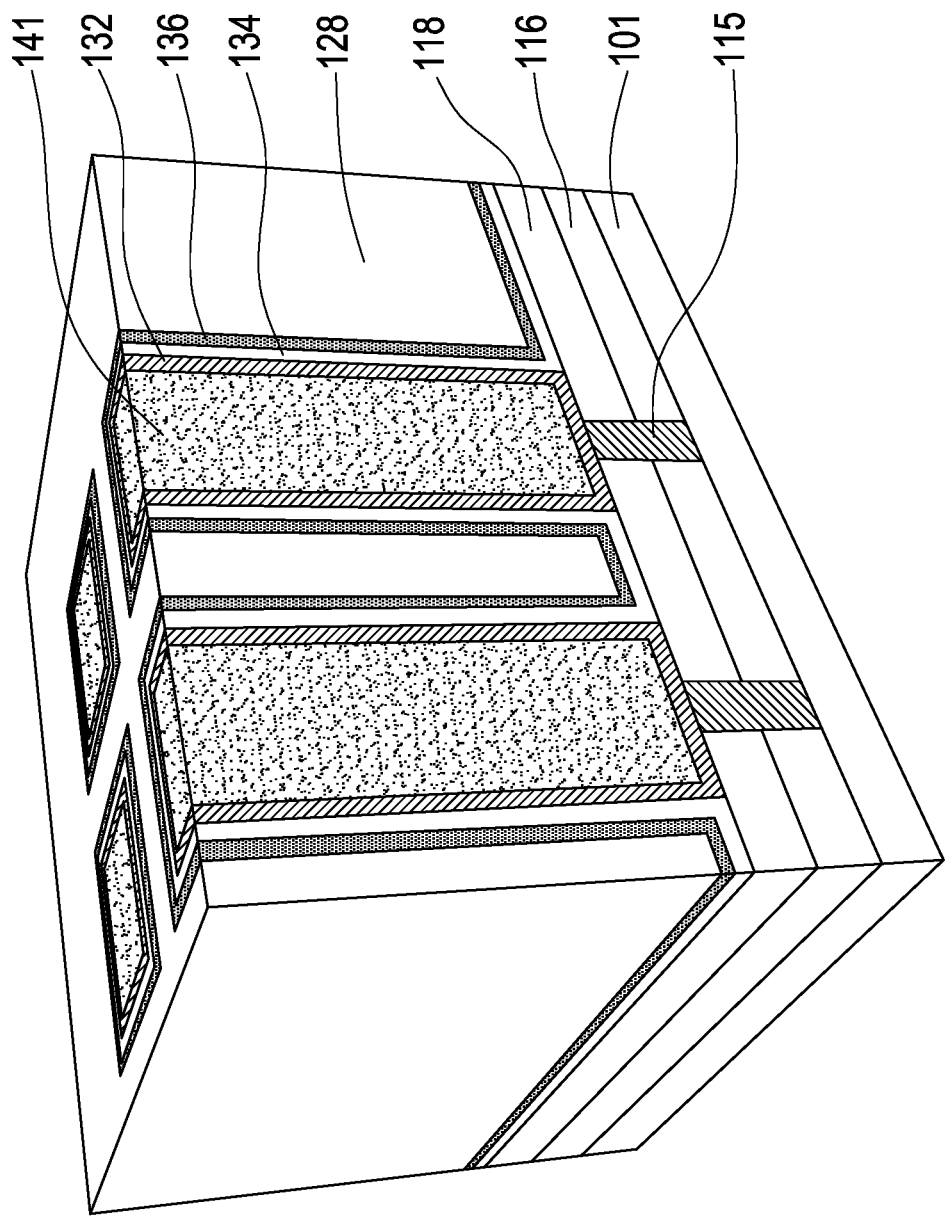

Referring to FIG. 12 and FIG. 13, an etching back process is performed to remove a portion of the filling material 140 and a portion of the lower electrode material 122, so as to form a plurality of filling structures 141 and a plurality of cup-shaped lower electrodes 132. After the etching back process, as shown in FIG. 13, the cup-shaped lower electrodes 132 are separated from each other to contact the conductive vias 115 respectively.

Figure 14:
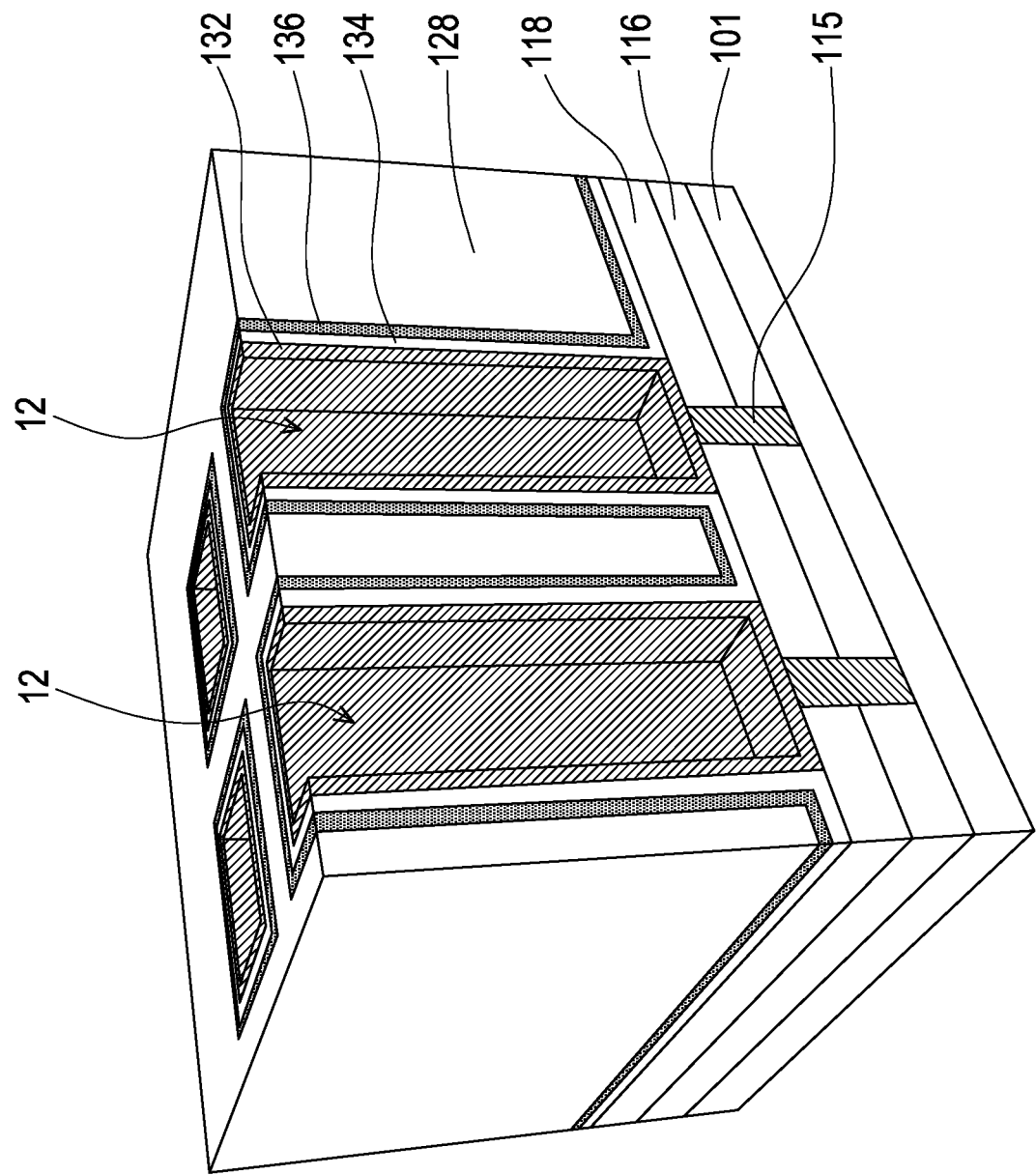

Referring to FIG. 13 and FIG. 14, the filling structures 141 are removed to expose inner surfaces of the cup-shaped lower electrodes 132. In some embodiments, the filling structures 141 are completely removed by a suitable removal process, such as ashing or stripping. In this case, as shown in FIG. 14, the inner surface of the cup-shaped lower electrodes 132 may define a plurality of openings 12. The openings 12 also correspond to the underlying conductive vias 115.

Figure 15:
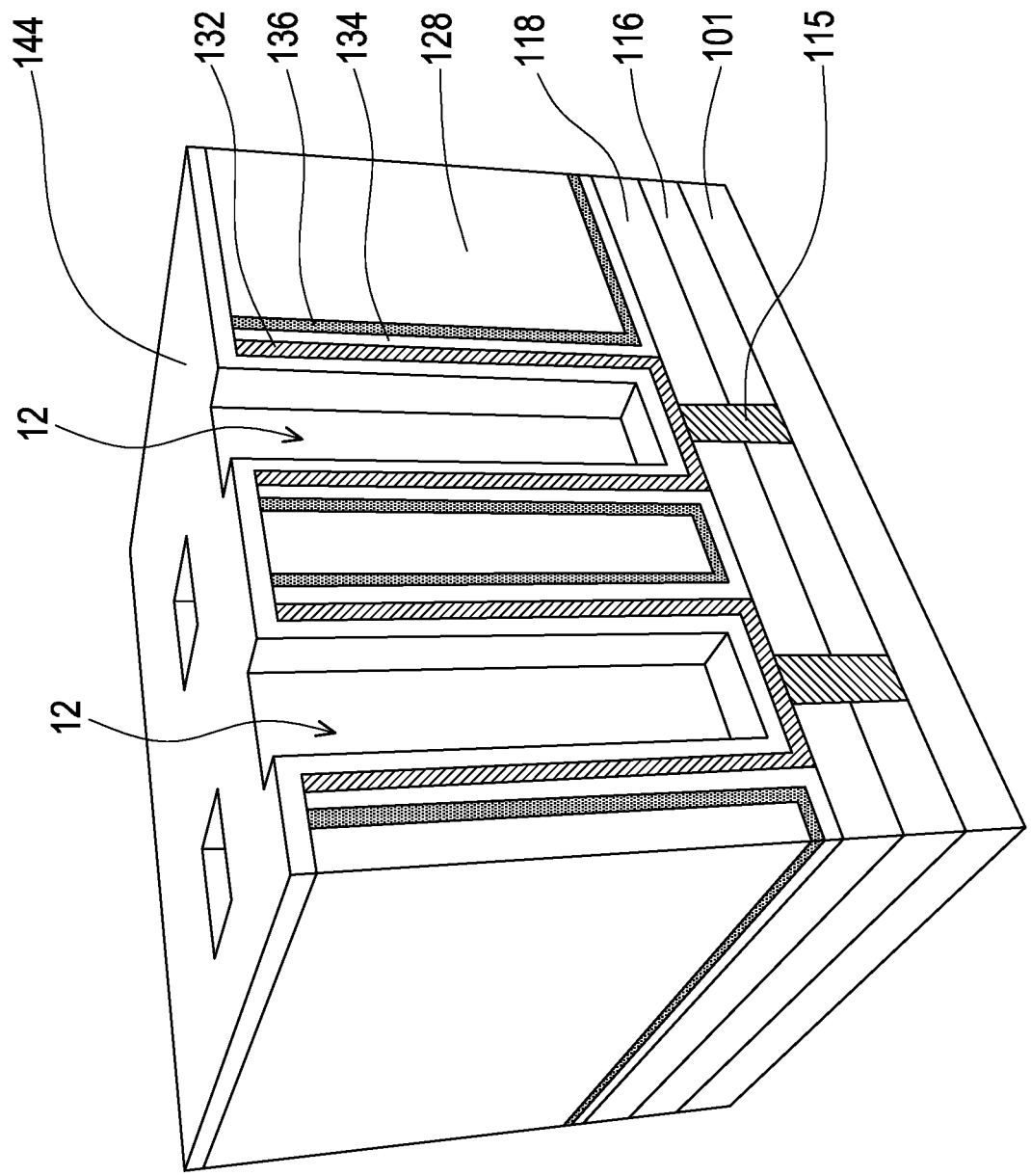

Referring to FIG. 14 and FIG. 15, a second capacitor dielectric layer 144 is formed to conformally cover surfaces of the openings 12 and further extend on the top surfaces of the dielectric layer 128, the first capacitor dielectric layer 134, and the first upper electrode 136. In some embodiments, the second capacitor dielectric layer 144 may include a high-k dielectric material, such as aluminum oxide (e.g., $Al_2O_3$), tantalum oxide (e.g., $Ta_2O_5$), lanthanum oxide (e.g., $La_2O_3$), hafnium oxide (e.g., $HfO_2$), zirconium oxide (e.g., $ZrO_2$), zirconium aluminum oxide (e.g., $ZrAl_xO_y$), hafnium aluminum oxide (e.g., $HfAl_xO_y$), bromide titanium oxide (e.g., $BrTiO_2$), strontium titanium oxide (e.g., $SrTiO_2$, $SrTiO_3$), or the like. The second capacitor dielectric layer 144 may be formed by one or more deposition processes, such as ALD, CVD, PVD, a combination thereof, and the like. In the present embodiment, the first capacitor dielectric material 124 may be formed as an aluminum oxide layer with a thickness of between about 3 nm and about 15 nm. However, any suitable material and any suitable thickness may be used for the second capacitor dielectric layer 144.

Figure 16A:
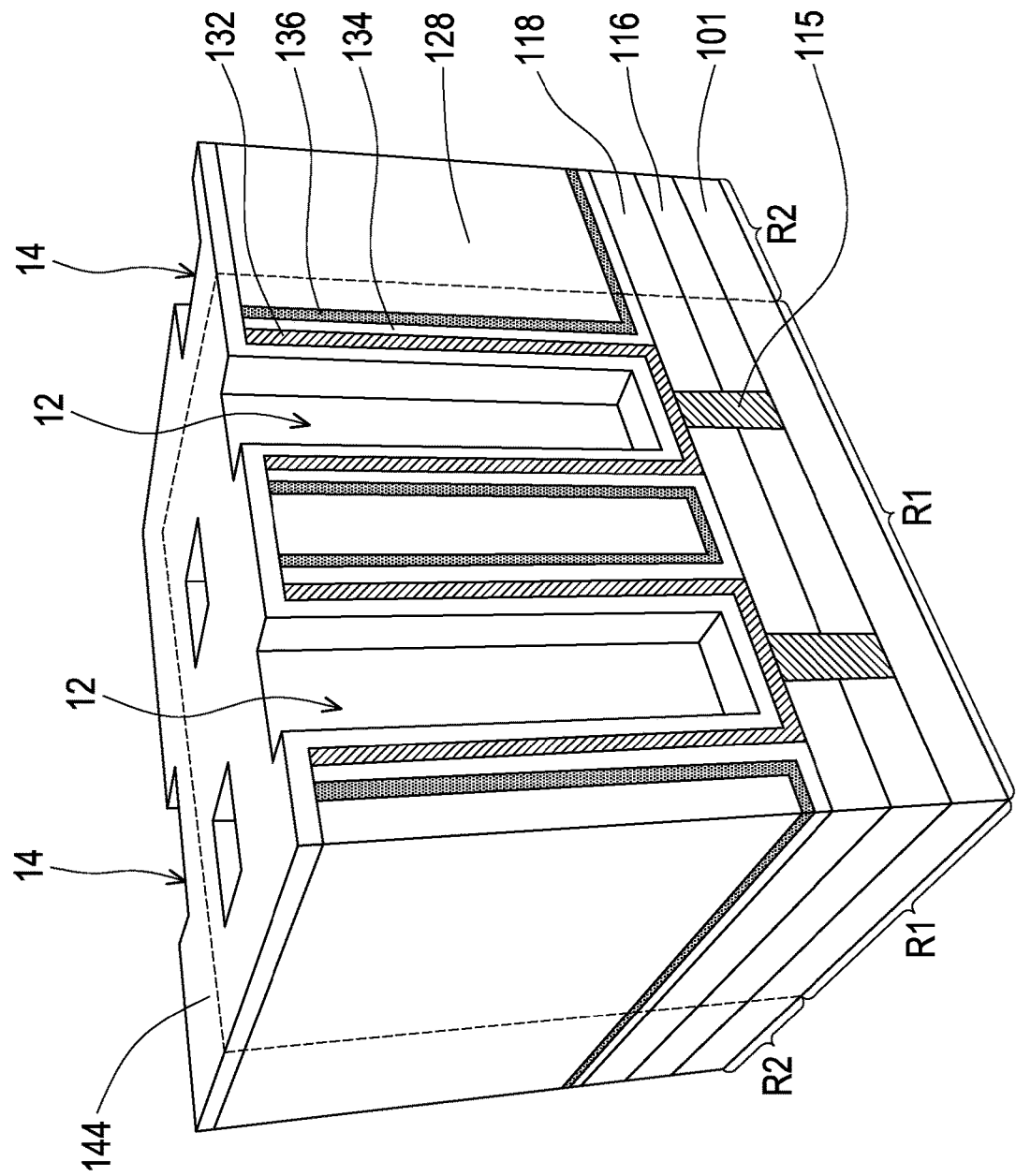
Figure 16B:
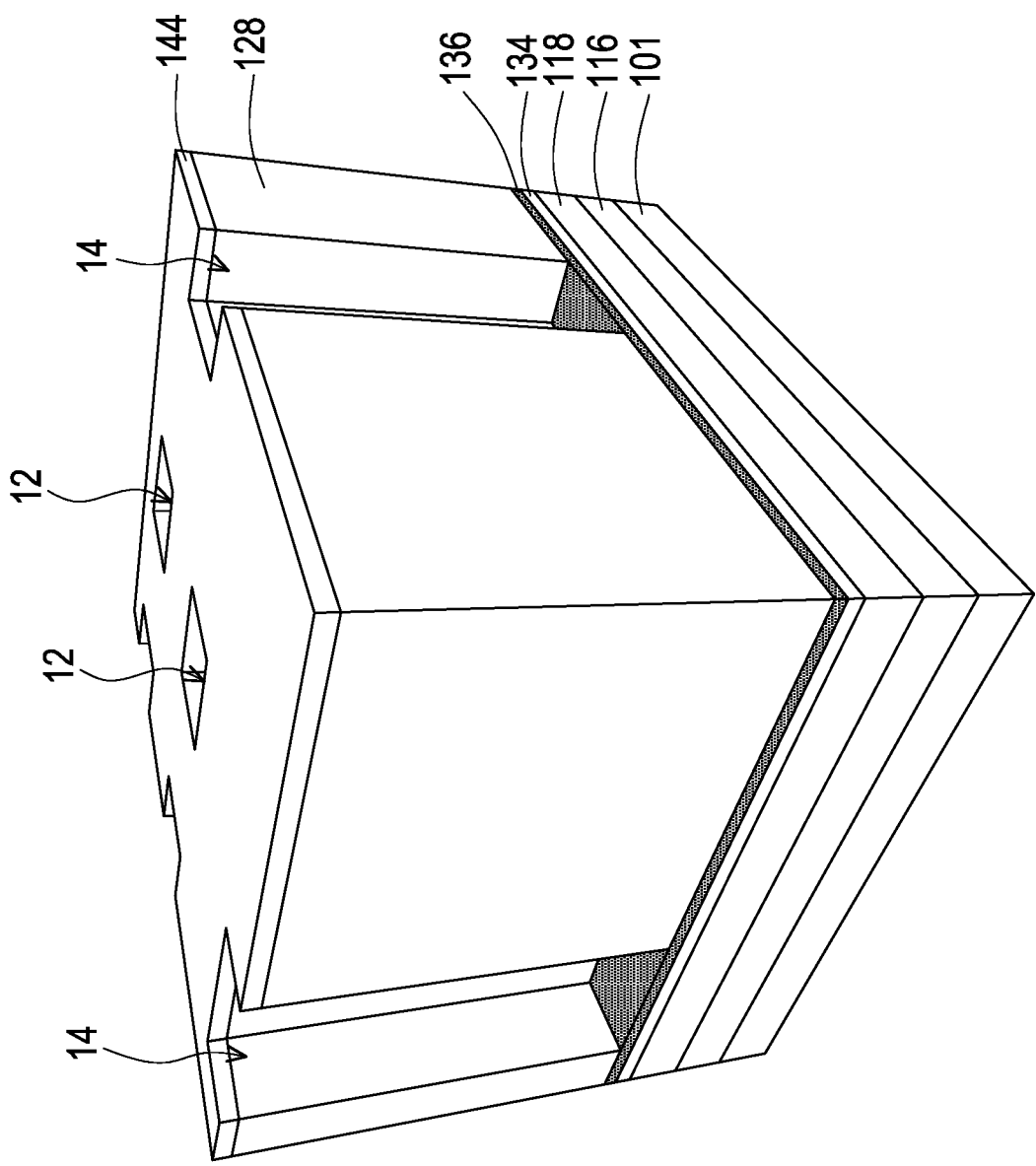

Referring to FIG. 16A and FIG. 16B, a plurality of openings 14 (may also be referred to as second openings) are formed in a peripheral region R2 surrounding an array region R1. Specifically, the structure illustrated in FIG. 16A has the array region R1 and the peripheral region R2. The conductive vias 115 arranged in a 2×2 array and the cup-shaped lower electrodes 132 thereon are disposed in the array region R1, and the area outside the array region R1 may be regarded as the peripheral region R2. FIG. 16B illustrates the perspective view of FIG. 16A horizontally rotated 180 degrees. As shown in FIG. 16B, the openings 14 penetrate through the dielectric layer 128 and the second capacitor dielectric layer 144 to expose a portion of the surface of the first upper electrode 136. Although FIG. 16B illustrates two openings 14, the embodiments of the present disclosure are not limited thereto. In other embodiments, the number of the openings 14 may be adjusted according to needs. For example, the number of the openings 14 may be one or more than two.

Figure 17A:
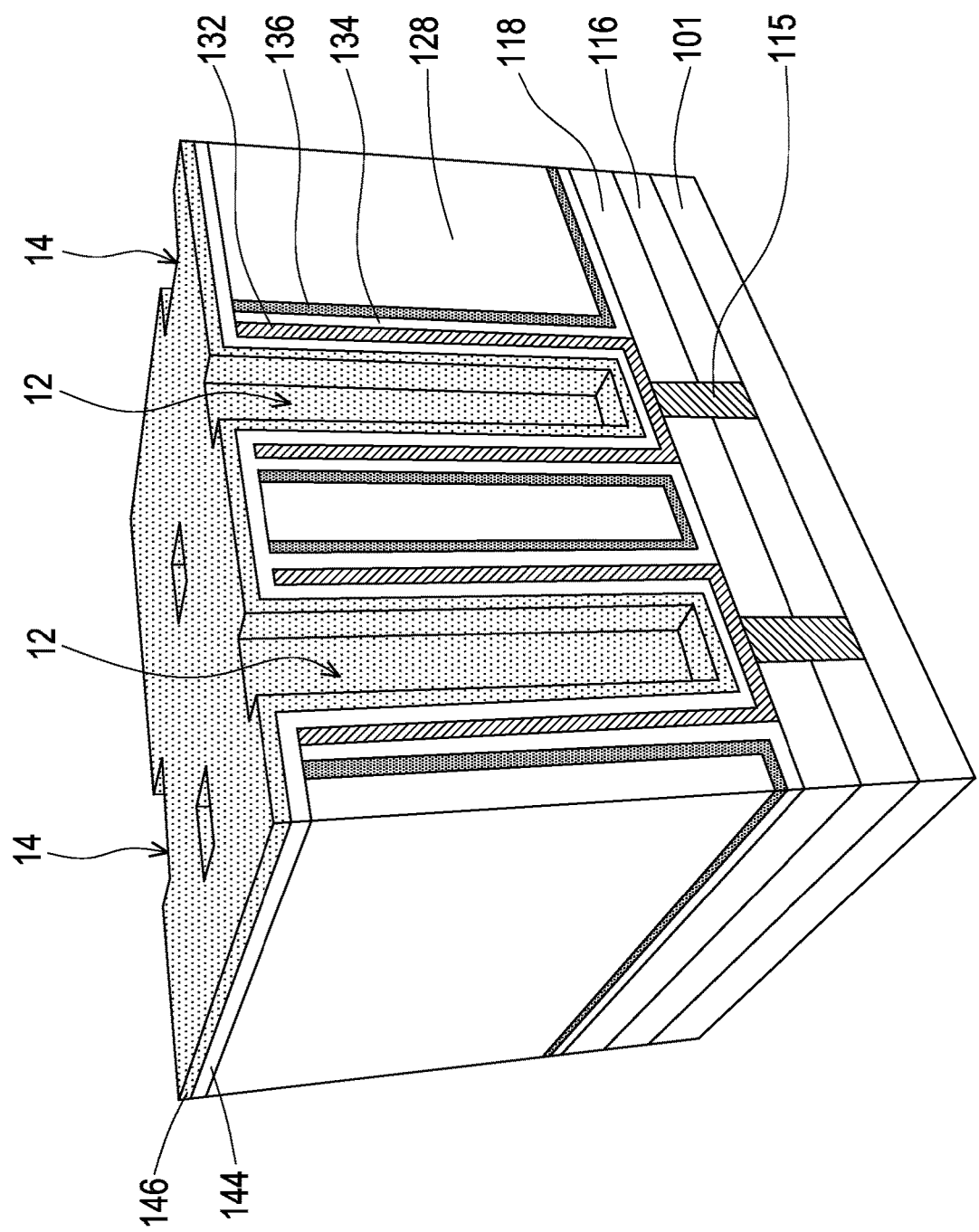
Figure 17B:
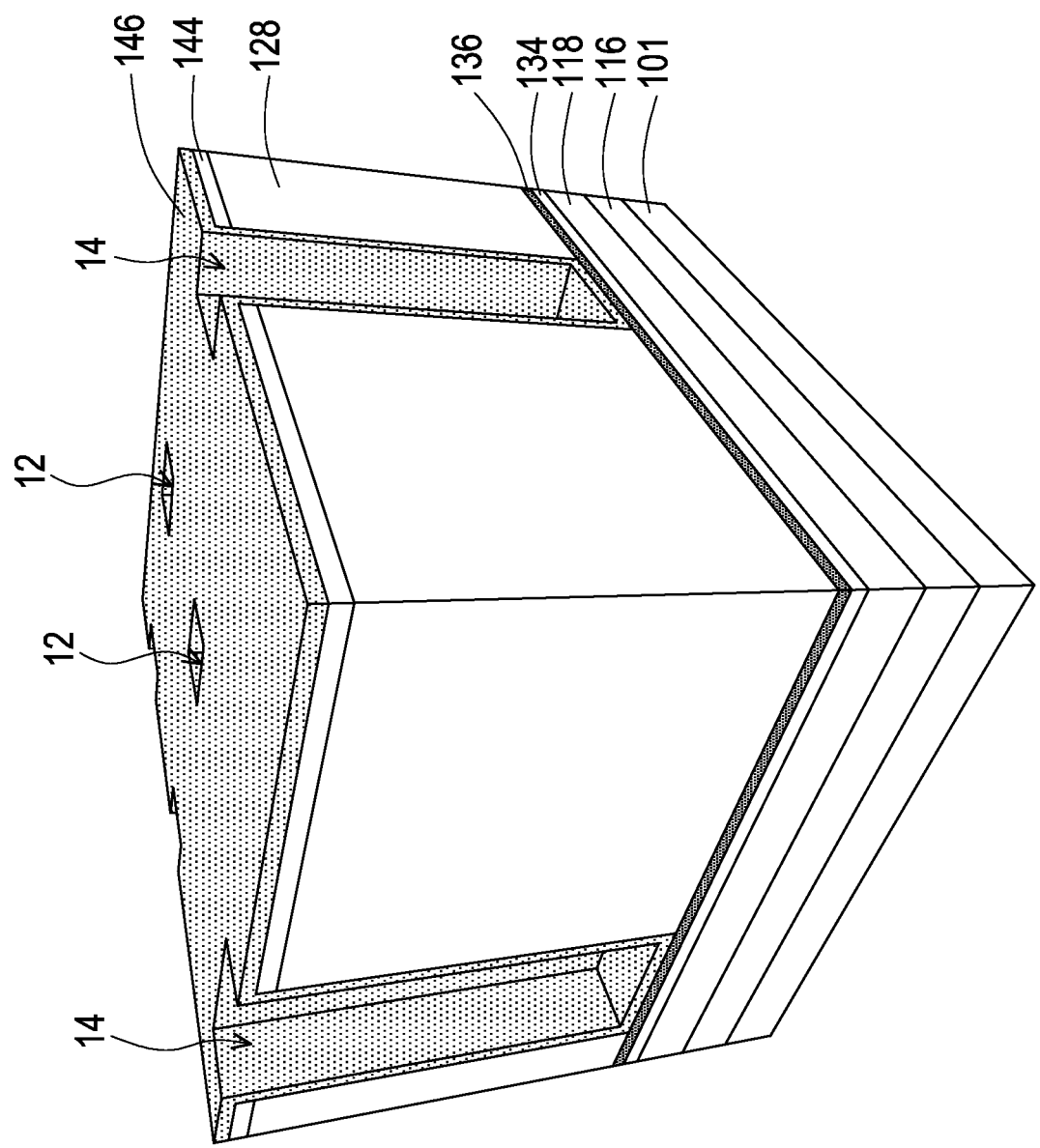

Referring to FIG. 17A and FIG. 17B, a second upper electrode 146 is formed on the second capacitor dielectric layer 144. In detail, as shown in FIG. 17A, the second upper electrode 146 conformally cover the surfaces of the openings 12 and further extend on the top surfaces of the dielectric layer 128, the cup-shaped lower electrodes 132, the first capacitor dielectric layer 134, and the first upper electrode 136. FIG. 17B illustrates the perspective view of FIG. 17A horizontally rotated 180 degrees. As shown in FIG. 17B, the second upper electrode 146 further extends to fill in the openings 14. In some embodiments, the second upper electrode 146 conformally covers the surfaces of the openings 14 to directly contact the first upper electrode 136.

In some embodiments, the second upper electrode 146 may include a conductive material with the low resistivity, such as titanium, titanium nitride, tantalum, tantalum nitride, tantalum silicon nitride, titanium silicon nitride, tungsten nitride (e.g., WN, $WN_2$), tungsten silicon nitride, titanium aluminum, copper, aluminum, cobalt, ruthenium, iridium, iridium oxide, platinum, tungsten, or the like. In some embodiments, the second upper electrode 146 may be formed by one or more deposition processes, such as ALD, CVD, PVD, a combination thereof, and the like. In the present embodiment, the second upper electrode 146 may be formed as a titanium nitride layer with a thickness of between about 3 nm and about 50 nm. However, any suitable material and any suitable thickness may be used for the second upper electrode 146. In some embodiments, the second upper electrode 146 and the first upper electrode 136 may have the same material or different materials.

Referring to FIG. 18A to FIG. 18D, a plurality of insulating pillars 148 are formed on the second upper electrode 146. Specifically, the insulating pillars 148 are formed including following process. An insulating material (not shown) is formed on the second upper electrode 146 and filled in the openings 12 and 14. A planarization process is performed to remove an excess portion of the insulating material on the second upper electrode 146, so that the insulating pillars 148 and the second upper electrode 146 have the top surfaces level with each other. In some embodiments, the planarization process includes a CMP process or the like. In some embodiments, the insulating material includes silicon nitride, silicon oxide, silicon oxynitride; phosphosilicate glass (PSG), borosilicate glass (BSG), boron-doped phosphosilicate glass (BPSG), or the like, or a combination thereof.

Figure 18A:
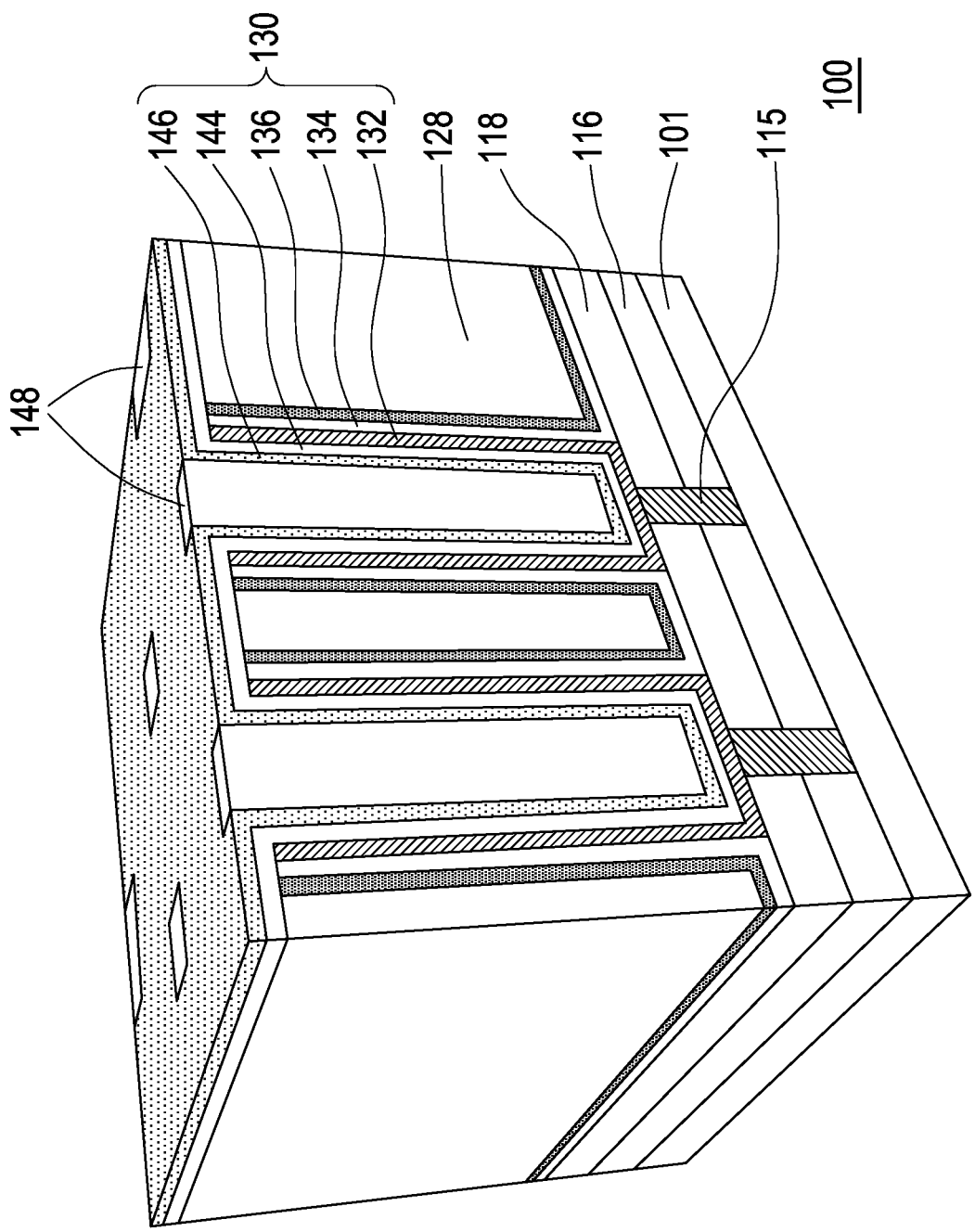

After forming the insulating pillars 148, the memory device 100 with a plurality of capacitor structures 130 is accomplished. The capacitor structures 130 may be referred to as the storage node for the memory device 100 (e.g., DRAM device). In some embodiments, as shown in FIG. 18A, the memory device 100 includes the underlying structure 101, the conductive vias 115, the dielectric layer 128, and the capacitor structures 130. In detail, the conductive vias 115 may be disposed on the underlying structure 101 to be arranged in a 2×2 array. The capacitor structures 130 are respectively disposed in the dielectric layer 128 and landed on the conductive vias 115. That is, the capacitor structures 130 is also arranged in a 2×2 array. Each capacitor structure 130 may include the cup-shaped lower electrode 132, the first capacitor dielectric layer 134, the first upper electrode 136, the second capacitor dielectric layer 144, and the second upper electrode 146. The first upper electrode 136 may conformally cover the outer surfaces of the cup-shaped lower electrode 132, and further extends to cover the top surface of the etching stop layer 118. The first capacitor dielectric layer 134 may be disposed between the outer surfaces of the cup-shaped lower electrode 132 and the first upper electrode 136, and between the top surface of the etching stop layer 118 and the first upper electrode 136. The second upper electrode 146 may conformally cover the inner surfaces of the cup-shaped lower electrode 132, and further extends to cover the top surfaces of the dielectric layer 128, the cup-shaped lower electrode 132, the first capacitor dielectric layer 134, and the first upper electrode 136. In some embodiments, the second upper electrode 146 may extend from the inner surfaces of the cup-shaped lower electrode 132 to be in direct contact the top surfaces of the dielectric layer 128, the cup-shaped lower electrode 132, the first capacitor dielectric layer 134, and the first upper electrode 136. The second capacitor dielectric layer 144 may be disposed between the inner surfaces of the cup-shaped lower electrode 132 and the second upper electrode 146, and between the top surface of the dielectric layer 128, the cup-shaped lower electrode 132, the first capacitor dielectric layer 134, and the first upper electrode 136 and the second upper electrode 146.

It should be noted that, in the present embodiment, the double-layered capacitor dielectric structure (e.g., layers 134 and 144) can provide a relatively large capacitance while consuming a relatively small chip area. Therefore, the capacitor structures 130 are able to increase the storage density, thereby enhancing the performance of the memory device 100. In addition, the first upper electrode 136 may continuously extends between the facing outer surfaces of two adjacent capacitor structures 130. In such embodiment, the first upper electrode 136 of the two adjacent capacitor structures 130 can be regarded as equipotential during operation, which can effectively reduce the parasitic capacitance between the two adjacent capacitor structures 130, thereby improving the performance of the memory device 100. Further, FIG. 18A illustrates the single-layered dielectric layer 128, however the embodiments of the present disclosure are not limited thereto. In other embodiments, the film stack having one or more dielectric films stacked vertically may be used to replace the single-layered dielectric layer 128. In this case, the capacitor structures 130 may be embedded in the film stack having one or more dielectric films stacked vertically to form the deep trench capacitor structures 130, thereby increasing the storage density of the memory device. In some embodiments, the capacitor structures 130 may extend between any two tiers of the interconnect structure in the BEOL. For example, the capacitor structures 130 may extend between the metal 2 (M2) and the M3, between the M2 and the M4, between the M2 and the M5 of the interconnect structure, and so on. Therefore, the fabricating process of the memory device may be compatible with the BEOL process of the semiconductor device, thereby simplifying process steps and efficiently improving the integration density.

Figure 18B:
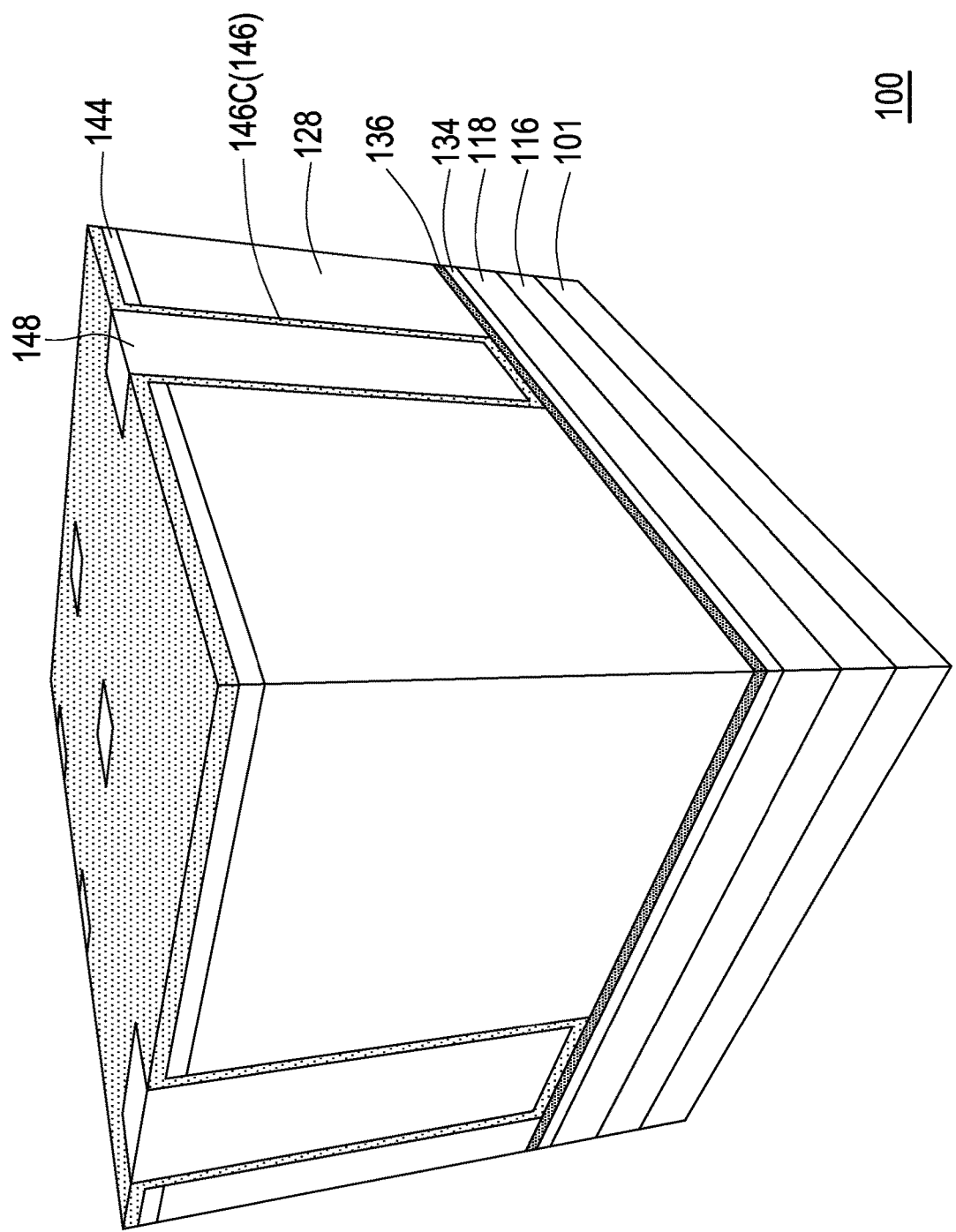

FIG. 18B illustrates the perspective view of FIG. 18A horizontally rotated 180 degrees. As shown in FIG. 18B, a portion of the second upper electrode 146 further extends through the second capacitor dielectric layer 144 and the dielectric layer 128 to directly contact the first upper electrode 136 and form a plurality of connection vias 146C. In this case, one of the connection vias 146C conformally covers the surface of the insulating pillar 148 to form a U-shaped structure in a cross-section. It should be noted that, in the present embodiment, the second upper electrode 146 is electrically connected to the first upper electrode 136 by the connection vias 146C, so that the first upper electrode 136 and the second upper electrode 146 have the same operation voltage during the operation. Therefore, the parasitic capacitance between the adjacent first upper electrode 136 and the second upper electrode 146 can be reduced, thereby improving the performance of the memory device 100. In some embodiments, the second upper electrode 146 and the connection vias 146C have the same conductive material (e.g., titanium nitride), and are formed in the same deposition step, as shown in FIG. 16A.

Figure 18C:
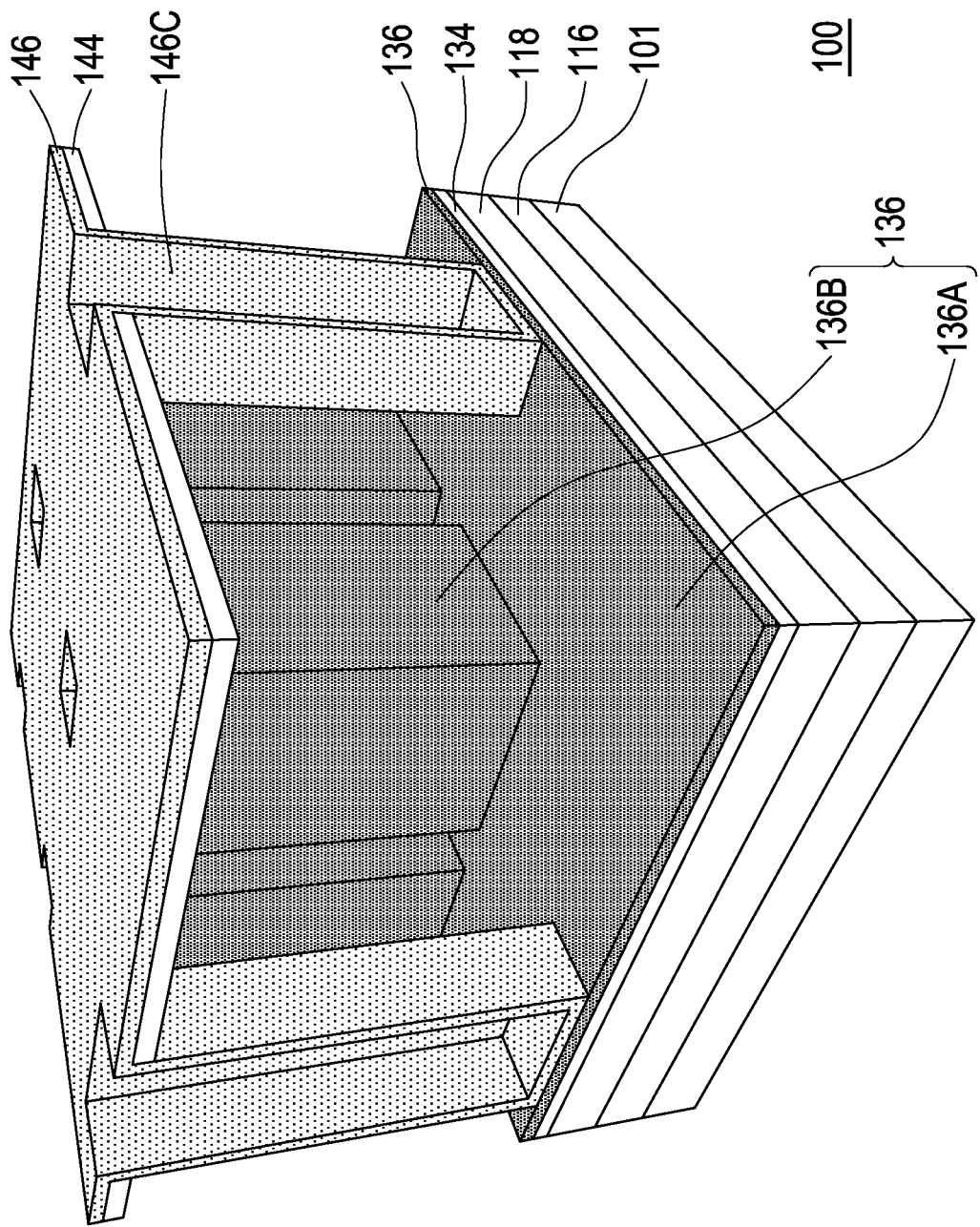
Figure 18D:
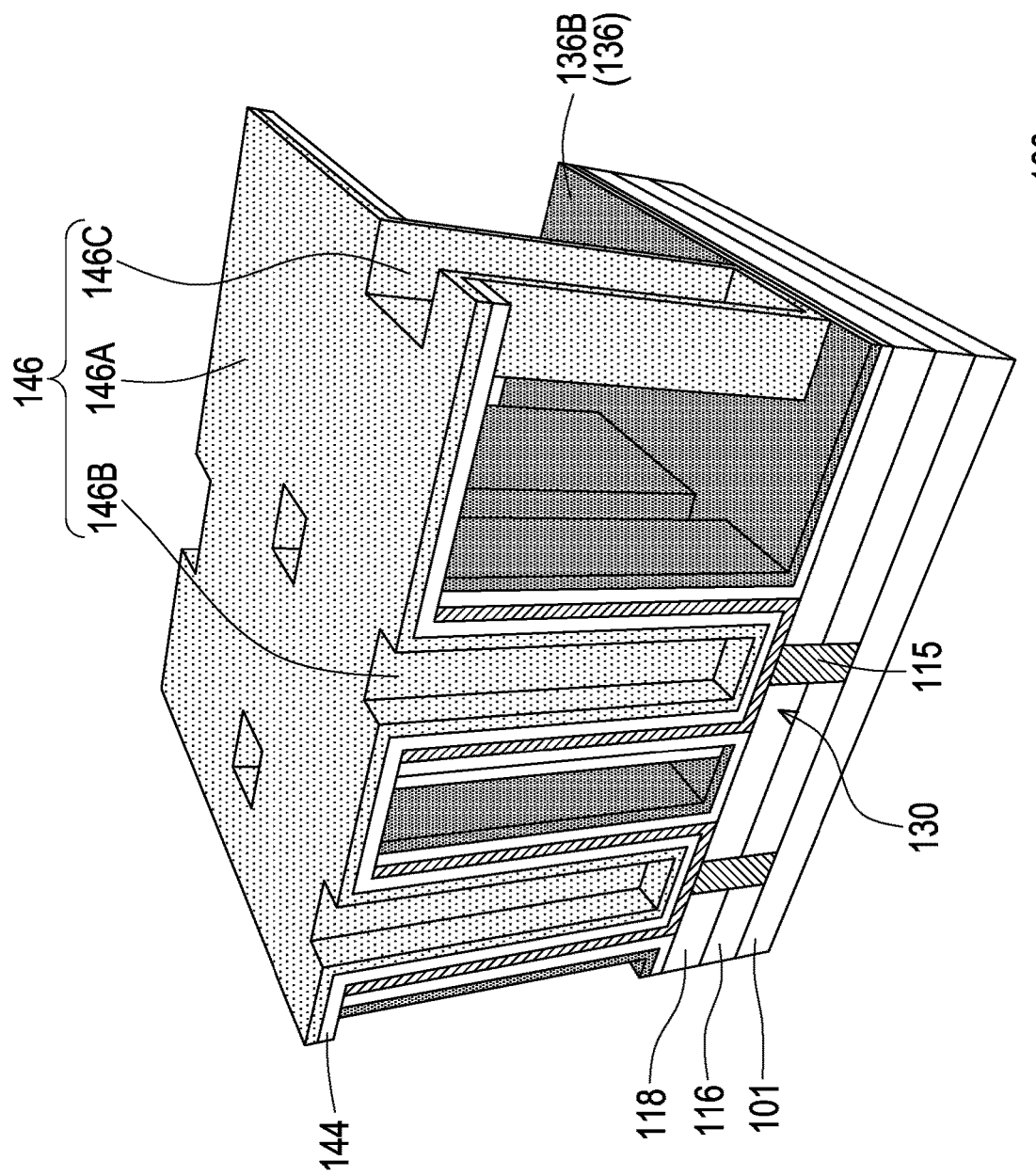

For clarity, FIG. 18C is a perspective view of omitting the dielectric layer 128 and the insulating pillar 148 in FIG. 18B, and FIG. 18D is a perspective view of omitting the dielectric layer 128 and the insulating pillar 148 in FIG. 18A. As shown in FIG. 18C, the first upper electrode 136 may include a bottom plane layer 136A and a plurality of extending portions 136B. In some embodiments, the extending portions 136B extend upward from a top surface of the bottom plane layer 136A, and the extending portions 136B conformally covers the outer surfaces of the cup-shaped lower electrodes 132. In addition, a portion of the first capacitor dielectric layer 134 further extends between the bottom plane layer 136A and the etching stop layer 118. As shown in FIG. 18D, the second upper electrode 146 may include a top plane layer 146A, a plurality of first fork-shaped structures 146B, and a plurality of second fork-shaped structures 146C. The first fork-shaped structures 146B may extend downward from the top plane layer 146A to cover a surface of the openings defined by the inner surfaces of the cup-shaped lower electrodes 132. That is, each first fork-shaped structure 146B may have an inner surface to define an opening to accommodate the insulating pillar 148 (as shown in FIG. 18A), and illustrate as a U-shaped structure in a cross-section. In addition, a portion of the second capacitor dielectric layer 144 further extends laterally below the top planar layer 146A. On the other hands, the second fork-shaped structures 146C may extend downward from the top planar layer 146A to directly contact the bottom planar layer 136A of the first upper electrode 136. As such, the second fork-shaped structures 146C may be electrically connected to the bottom planar layer 136A of the first upper electrode 136 and the top planar layer 146A of the second upper electrode 146. Further, each second fork-shaped structure 146C may have an inner surface to define an opening to accommodate the insulating pillar 148 (as shown in FIG. 18B), and illustrate as a U-shaped structure in a cross-section.

Figure 19:
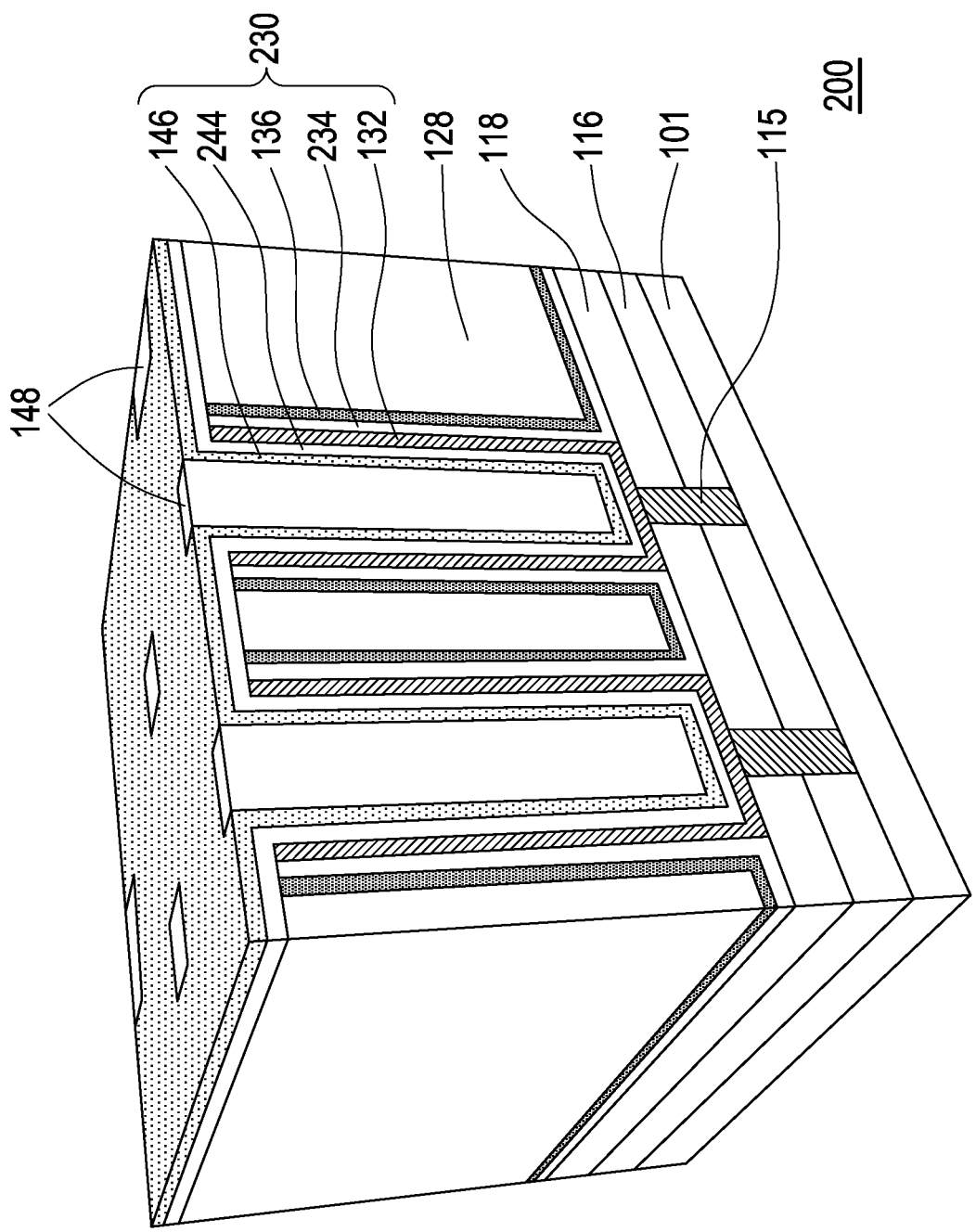
FIG. 19 illustrates a simplified perspective view of a memory device in accordance with some alternative embodiments.

FIG. 19 illustrates a simplified perspective view of a memory device 200 in accordance with some alternative embodiments.

Referring to FIG. 19, the memory device 200 is similar to the memory device 100 of FIG. 18A, that is, the configurations, materials, and functions of the memory device 200 are similar to those of the memory device 100, and thus the details are omitted herein. The main difference between the memory device 200 and the memory device 100 lies in that the memory device 200 have a first capacitor dielectric layer 234 and a second capacitor dielectric layer 244 with different dielectric constants. For example, the first capacitor dielectric layer 234 may be made of aluminum oxide (e.g., $Al_2O_3$) and the second capacitor dielectric layer 244 may be made of hafnium oxide (e.g., $HfO_2$). However, any suitable material may be used for the first capacitor dielectric layer 234 and the second capacitor dielectric layer 244. In the present embodiment, the capacitor dielectric layers 234 and 244 in the capacitor structure 230 can be freely replaced by other suitable materials, thereby providing high degree of freedom to fabrications.

According to some embodiments, a memory device includes a substrate; a dielectric layer disposed on the substrate; and a plurality of capacitor structures respectively disposed in the dielectric layer. Each capacitor structure includes: a cup-shaped lower electrode; a first upper electrode conformally covering an outer surface of the cup-shaped lower electrode; a first capacitor dielectric layer disposed between the outer surface of the cup-shaped lower electrode and the first upper electrode; a second upper electrode conformally covering an inner surface of the cup-shaped lower electrode, wherein the second upper electrode is electrically connected to the first upper electrode by at least one connection via; and a second capacitor dielectric layer disposed between the inner surface of the cup-shaped lower electrode and the second upper electrode. In some embodiments, the at least one connection via conformally covers an opening penetrating through the dielectric layer to form a U-shaped structure in a cross-section. In some embodiments, the second upper electrode further extends to cover a top surface of the dielectric layer to directly contact a top of the at least one connection via, and a bottom of the at least one connection via directly contacts the first upper electrode. In some embodiments, the second upper electrode and the at least one connection via have the same conductive material, and are formed in the same deposition step. In some embodiments, the memory device further includes: a plurality of transistors disposed in the substrate; and a plurality of conductive vias respectively disposed between the plurality of transistors and the plurality of capacitor structures, wherein each conductive via is electrically connected to one of a pair of source/drain regions of a corresponding transistor and the cup-shaped lower electrode of a corresponding capacitor structure. In some embodiments, the first upper electrode continuously extends between facing outer surfaces of two adjacent capacitor structures. In some embodiments, the first capacitor dielectric layer and the second capacitor dielectric layer have different dielectric constants. In some embodiments, the second capacitor dielectric layer further extends and directly contacts a top surface of the cup-shaped lower electrode, a top surface of the first capacitor dielectric layer, a top surface of the first upper electrode, and a top surface of the dielectric layer.

According to some embodiments, a method of forming a memory device includes: providing a substrate having an array region and a peripheral region; forming a plurality of sacrificial structures on the substrate in the array region; sequentially forming a first capacitor dielectric layer and a first upper electrode to conformally cover an outer surface of the plurality of sacrificial structures; forming a dielectric layer on the first upper electrode, so that the dielectric layer laterally wraps the plurality of sacrificial structures; removing the plurality of sacrificial structures to form a plurality of first openings; forming a lower electrode material to conformally cover a surface of the plurality of first openings and extend to cover a top surface of the dielectric layer; forming a photoresist material on the lower electrode material to fill in the plurality of first openings; performing an etching back process to remove a portion of the photoresist material and a portion of the lower electrode material, so as to form a plurality of cup-shaped lower electrodes separated from each other; removing the photoresist material to expose an inner surface of the plurality of cup-shaped lower electrodes; forming a second capacitor dielectric layer to conformally cover the inner surface of the plurality of cup-shaped lower electrodes; forming at least one second opening in the peripheral region, wherein the at least one second opening penetrates through the dielectric layer and the second capacitor dielectric layer to expose a portion of a surface of the first upper electrode; and forming a second upper electrode on the second capacitor dielectric layer, wherein the second upper electrode further extends to fill in the at least one second opening to form at least one connection via. In some embodiments, the method further includes: forming a plurality of conductive vias on the substrate in the array region, wherein the plurality of conductive vias are respectively exposed by the plurality of first openings after removing the plurality of sacrificial structures. In some embodiments, the forming the plurality of sacrificial structures comprises: forming a sacrificial layer on the substrate; and patterning the sacrificial layer to form the plurality of sacrificial structures corresponding to the plurality of conductive vias. In some embodiments, the forming the first capacitor dielectric layer, the first upper electrode, and the dielectric layer comprises: forming a first capacitor dielectric material to conformally cover the substrate and the outer surface of the plurality of sacrificial structures; forming a first upper electrode material on the first capacitor dielectric material; forming a dielectric material on the first upper electrode material; and performing a planarization process to remove a portion of the dielectric material, a portion of the first upper electrode material, and a portion of the first capacitor dielectric material to expose a top surface of the plurality of sacrificial structures, thereby forming the dielectric layer, the first upper electrode, and the first capacitor dielectric layer. In some embodiments, the at least one second opening is formed after forming the second capacitor dielectric layer and before forming the second upper electrode. In some embodiments, the second upper electrode and the at least one connection via have the same conductive material, and are formed in the same deposition step. In some embodiments, the method further includes: forming a plurality of insulating pillars respectively on the second upper electrode and the at least one connection via.

According to some embodiments, a capacitor structure includes: a substrate; a plurality of lower electrodes disposed on the substrate, wherein the plurality of lower electrodes have an inner surface to define a plurality of first openings; a first upper electrode overlying an outer surface of the plurality of lower electrodes, wherein the first upper electrode further extends to cover a top surface of the substrate to form a bottom plane layer; a first capacitor dielectric layer at least disposed between the plurality of lower electrodes and the first upper electrode; a second upper electrode comprising: a top plane layer; a plurality of first fork-shaped structures extending from the top plane layer to cover a surface of the plurality of first openings; and a plurality of second fork-shaped structures extending from the top planar layer to directly contact the bottom planar layer of the first upper electrode; and a second capacitor dielectric layer at least disposed between the plurality of lower electrodes and the second upper electrode. In some embodiments, each first fork-shaped structure has an inner surface to define a second opening; and each second fork-shaped structure has an inner surface to define a third opening. In some embodiments, the plurality of second fork-shaped structures are electrically connected to the bottom planar layer of the first upper electrode and the top planar layer of the second upper electrode. In some embodiments, the first capacitor dielectric layer and the second capacitor dielectric layer have different dielectric constants. In some embodiments, the first capacitor dielectric layer further extends between the bottom planar layer and the substrate, and the second capacitor dielectric layer further extends laterally below the top planar layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitor structure, comprising:
   a substrate;
   a plurality of lower electrodes disposed on the substrate, wherein the plurality of lower electrodes have an inner surface to define a plurality of first openings;
   a first upper electrode overlying an outer surface of the plurality of lower electrodes, wherein the first upper electrode further extends to cover a top surface of the substrate to form a bottom plane layer;
   a first capacitor dielectric layer at least disposed between the plurality of lower electrodes and the first upper electrode;
   a second upper electrode comprising:
      a top plane layer;
      a plurality of first fork-shaped structures extending from the top plane layer to cover a surface of the plurality of first openings; and
      a plurality of second fork-shaped structures extending from the top planar layer to directly contact the bottom planar layer of the first upper electrode; and
   a second capacitor dielectric layer at least disposed between the plurality of lower electrodes and the second upper electrode.

2. The capacitor structure according to claim 1, wherein each first fork-shaped structure has an inner surface to define a second opening; and each second fork-shaped structure has an inner surface to define a third opening.

3. The capacitor structure according to claim 1, wherein the plurality of second fork-shaped structures are electrically connected to the bottom planar layer of the first upper electrode and the top planar layer of the second upper electrode.

4. The capacitor structure according to claim 1, wherein the first capacitor dielectric layer and the second capacitor dielectric layer have different dielectric constants.

5. The capacitor structure according to claim 1, wherein the first capacitor dielectric layer further extends between the bottom planar layer and the substrate, and the second capacitor dielectric layer further extends laterally below the top planar layer.

6. The capacitor structure according to claim 2, further comprising a plurality of insulating pillars filled into the second and third openings respectively.

7. The capacitor structure according to claim 1, wherein the plurality of first fork-shaped structures are separated from the plurality of lower electrodes by the second capacitor dielectric layer.

8. The capacitor structure according to claim 1, wherein the second capacitor dielectric layer further extends and directly contacts top surfaces of the plurality of lower electrodes, the first capacitor dielectric layer, and the first upper electrode.

9. A memory device, comprising:
   a substrate;
   a dielectric layer, disposed on the substrate; and
   a plurality of capacitor structures, respectively disposed in the dielectric layer, wherein the plurality of capacitor structures comprise:
      a plurality of lower electrodes having an inner surface to define a plurality of first openings;
      a first upper electrode overlying an outer surface of the plurality of lower electrodes, wherein the first upper electrode extends between a top surface of the substrate and a bottom surface of the dielectric layer to form a bottom plane layer;
      a first capacitor dielectric layer at least disposed between the plurality of lower electrodes and the first upper electrode;
      a second upper electrode comprising:
         a top plane layer;
         a plurality of first fork-shaped structures extending from the top plane layer to cover a surface of the plurality of first openings; and
         a plurality of second fork-shaped structures extending from the top planar layer to directly contact the bottom planar layer of the first upper electrode; and
      a second capacitor dielectric layer at least disposed between the plurality of lower electrodes and the second upper electrode.

10. The memory device according to claim 9, wherein the plurality of second fork-shaped structures extend from a top surface of the dielectric layer to the bottom surface of the dielectric layer to form a U-shaped structure in a cross-section.

11. The memory device according to claim 9, further comprising:
    a plurality of transistors disposed in the substrate; and
    a plurality of conductive vias respectively disposed between the plurality of transistors and the plurality of capacitor structures, wherein each conductive via is electrically connected to one of a pair of source/drain regions of a corresponding transistor and a corresponding lower electrode of a corresponding capacitor structure.

12. The memory device according to claim 9, wherein the first upper electrode continuously extends between facing outer surfaces of two adjacent capacitor structures.

13. The memory device according to claim 9, wherein the first capacitor dielectric layer and the second capacitor dielectric layer have different dielectric constants.

14. The memory device according to claim 9, wherein the second capacitor dielectric layer further extends and directly contacts top surfaces of the plurality of lower electrodes, the first capacitor dielectric layer, the first upper electrode, and the dielectric layer.

15. A method of forming a capacitor structure, comprising:
    forming a plurality of lower electrodes on a substrate, wherein the plurality of lower electrodes have an inner surface to define a plurality of first openings;
    forming a first upper electrode to overlay an outer surface of the plurality of lower electrodes, wherein the first upper electrode further extends to cover a top surface of the substrate to form a bottom plane layer;
    forming a first capacitor dielectric layer between the plurality of lower electrodes and the first upper electrode;
    forming a second capacitor dielectric layer to overlay the plurality of first openings and extend to cover top surfaces of the plurality of lower electrodes, the first capacitor dielectric layer, and the first upper electrode; and
    forming a second upper electrode on the second capacitor dielectric layer, wherein the second upper electrode comprising:
       a top plane layer;
       a plurality of first fork-shaped structures extending from the top plane layer to cover a surface of the plurality of first openings; and a plurality of second fork-shaped structures extending from the top planar layer to directly contact the bottom planar layer of the first upper electrode.

16. The method according to claim 15, wherein forming the plurality of lower electrodes comprises:
   forming a plurality of sacrificial structures on the substrate;
   sequentially forming the first capacitor dielectric layer and the first upper electrode to conformally cover an outer surface of the plurality of sacrificial structures;
   forming a dielectric layer on the first upper electrode, so that the dielectric layer laterally wraps the plurality of sacrificial structures;
   removing the plurality of sacrificial structures to form a plurality of second openings;
   forming a lower electrode material to conformally cover a surface of the plurality of second openings and extend to cover a top surface of the dielectric layer;
   forming a photoresist material on the lower electrode material to fill in the plurality of second openings;
   performing an etching back process to remove a portion of the photoresist material and a portion of the lower electrode material, so as to form the plurality of lower electrodes separated from each other; and
   removing the photoresist material to expose the inner surface of the plurality of lower electrodes.

17. The method according to claim 16, wherein forming the second upper electrode comprises:
   after forming the second capacitor dielectric layer, forming a plurality of third openings, wherein the plurality of third openings penetrate through the dielectric layer and the second capacitor dielectric layer to expose a portion of a surface of the first upper electrode; and
   forming the second upper electrode on the second capacitor dielectric layer, wherein a first portion of the second upper electrode covering the plurality of first openings is formed into the plurality of first fork-shaped structures, and a second portion of the second upper electrode covering the plurality of third openings is formed into the plurality of second fork-shaped structures.

18. The method according to claim 15, wherein the plurality of second fork-shaped structures are electrically connected to the bottom planar layer of the first upper electrode and the top planar layer of the second upper electrode.

19. The method according to claim 15, wherein the first capacitor dielectric layer and the second capacitor dielectric layer have different dielectric constants.

20. The method according to claim 15, wherein the first capacitor dielectric layer further extends between the bottom planar layer and the substrate, and the second capacitor dielectric layer further extends laterally below the top planar layer.

* * * * *